United States Patent [19]
Caldwell et al.

[11] Patent Number: 5,548,839
[45] Date of Patent: Aug. 20, 1996

[54] WIDE BAND RADIO-FREQUENCY CONVERTER HAVING MULTIPLE USE OF INTERMEDIATE FREQUENCY TRANSLATORS

[76] Inventors: Stephen P. Caldwell, 5273 Bright Dawn Ct., Columbia, Md. 21045; Marvine Harris Jr., 5903 Highgate Dr., Baltimore, Md. 21215; Demetrios J. Matsakis, 2560 Ashbrook Dr., Ellicott City, Md. 21042; Ronald W. Minarik, 902 W. Seminary Ave., Lutherville, Md. 21093; Kenneth M. Schmidt, 2739 Thornbrook Rd., Ellicott City, Md. 21042; Benjamin F. Weigand, 4735 Ilkley Moor La., Baltimore, Md. 21215; Robert S. Prill, 3019 Tangier Dr., Allenwood, N.J. 08720; Arnold B. Siegel, 4 Kingsberry Dr., Somerset, N.J. 08873

[21] Appl. No.: 322,513

[22] Filed: Oct. 14, 1994

[51] Int. Cl.$^6$ ........................... H04B 1/26
[52] U.S. Cl. ................ 455/313; 455/303; 455/314; 455/339; 455/340
[58] Field of Search ...................... 455/313, 314, 455/315, 316, 317, 189.1, 190.1, 207, 266, 143, 303, 118, 22, 339, 340

[56] References Cited

U.S. PATENT DOCUMENTS

| | | | |
|---|---|---|---|
| 3,372,339 | 3/1968 | Harrison et al. | 455/314 |
| 5,010,400 | 4/1991 | Oto | 358/86 |
| 5,014,349 | 5/1991 | Kubu et al. | 455/189.1 |
| 5,108,334 | 4/1992 | Eschenbach et al. | 455/314 |
| 5,280,636 | 1/1994 | Kelley et al. | 455/131 |

*Primary Examiner*—Reinhard J. Eisenzopf
*Assistant Examiner*—Lee Nguyen

[57] ABSTRACT

A wideband RF-to-IF frequency converter providing multiple use of frequency conversion components for many different types of RF input signals. In specific examples, many different types of signals for communication, navigation, and for interrogation are processed through at least partly common frequency-conversion channels. Such RF input signals in the range from approximately 2 MHz to 2,000 MHz are converted to output IF frequencies, such as 1 MHz and 30 MHz, for further processing in the common receiver. Some narrow band signals, after conversion to IF, are subjected to off-center filtering in relatively broadband IF filters. Input RF filters are not used. Among several frequency conversion stages, only one of the local oscillator signals is tunable; but it is made tunable in relatively small, precise steps by using a double phase-locked loop arrangement in the frequency synthesizer.

11 Claims, 26 Drawing Sheets

WIDE BAND RADIO-FREQUENCY CONVERTER HAVING MULTIPLE USE OF INTERMEDIATE FREQUENCY TRANSLATORS

BACKGROUND OF THE INVENTION

1. Field of the Invention

The present invention relates to apparatus and a method for efficiently and economically converting radio frequencies to intermediate frequencies for further processing, particularly in applications in which multiple radio frequency inputs must be handled.

2. Description of the Related Art

In the related application fields of communication, navigation, surveillance and telemetry (collectively sometimes referred to as CNST), also known as communication, navigation, and interrogation (referred to as CNI), many signals must typically be handled at a single location. In the past, typically, a radio frequency transceiver, covering a specific portion of the radio frequency band and having a frequency converter of the type shown in FIG. 1, FIG. 2, or FIG. 3, is needed for each of these functions. It should be noted that each of the prior art frequency converters shown in FIG. 1, FIG. 2, and FIG. 3 accommodates at most several CNI functions and usually only a single CNI function, and that usually a separate prior art frequency converter is required to accommodate each CNI function. Some stations have needed more than ten different transceiver types. Moreover, when redundancy is needed in order to ensure high reliability of component function, or high availability of the overall functions, the total number of transceivers is frequently doubled or tripled.

The size, weight, and cost of such combined transceivers were so great that attempts were sometimes made to combine two or three functions into a common transceiver; but these efforts were usually doomed to failure because each function had unique transceiver requirements and the efforts to design and build a common transceiver made the cost prohibitive. The problem presented by any effort to combine transceiver functions is most severe when some of the functions not only must use very different frequencies, but also possess very different requirements with regard to: signal bandwidth, operation in the presence of various types of interference, frequency channel spacings, and switching speeds among various frequencies assigned to a particular function.

Heretofore, many potential applications for large-scale communication, navigation, surveillance and telemetry were precluded because the prior art implementations would have been much too large, weighty and costly.

It is desirable to solve or ameliorate one or more of the above-described problems.

SUMMARY OF THE INVENTION

In the broadest sense, our invention rests upon our recognition of a technique for reducing required circuit functions and for partitioning the frequency space in a way that reduces the total amount of circuit functions to the point where common RF to IF conversion is practical in applications where many of the channels are replicated many times in the different functions. Further, our invention significantly reduces the number of circuit components to perform the necessary CNST functions regardless of the level of integration of the circuitry at the circuit board or integrated semiconductor circuit level. This means that our invention will always provide lower cost, size and weight than implementation of the same functions based upon prior art.

According to a first feature of our invention, we provide a frequency plan that groups multiple intermediate-frequency stages, including these having different final stages and different final intermediate frequencies, so that a large percentage of common circuitry can be used for the intermediate frequency translators such that our invention always provides lower size, weight and cost than multiple CNST radio frequency converter implementations based upon prior art while maintaining performance equal or superior to implementations based upon prior art. Conversely, implementations based upon prior art, in an effort to reduce size, weight and cost, could not meet the radio frequency converter performance requirements for the wide range of multiple CNST functions herein.

According to a further feature of our invention, the frequency plan arranges intermediate frequency conversions, so that undesired signals—being for example, either radio frequency interference coexisting with the desired signals at the input, image signals at each frequency conversion stage created by co-existing radio frequency interference, undesirable signals generated within our wideband radio frequency converter due to co-existing radio frequency interference interacting with circuit nonlinearities, or undesirable sidebands generated at the various frequency conversion stages—do not cause unacceptable interference with the desired signals at the outputs of the final frequency converter stages. Among other things, this feature is made possible by providing a plurality of multiple frequency conversion alternatives for intermediate filter center frequencies and filter band widths in second and third converter stages, as well as alternative RF/IF multiple frequency converter combinations to avoid the effects of external co-existing interference for CNST functions that are more apt to be susceptible to such co-existing interference, either because of the strength of such interference or the proximity in frequency of such interference relative to the desired signals.

Moreover, less filter equipment is involved because of the multiple use of these intermediate frequency filters.

According to a third feature of the invention, it has been further recognized as the number of communication, navigation and interrogation type functions increases, with the commensurate increase of the input frequency range and the possible interference signals, it becomes important to avoid the escalation of the number of components by maintaining a consistent plan.

According to a fourth feature of our invention, that plan includes, among other things, using a tunable local oscillator signal only in the first conversion stage and providing increasing numbers of alternate paths in the subsequent stages together with the necessary switching before and after each stage to access all of the paths.

According to a preferred embodiment of the invention, the frequency converter includes first, second and sometimes third frequency converter stages. To the first frequency converter stage is applied a radio frequency signal after it has been RF prefiltered prior to and external to the system of our invention. The first frequency converter stage includes a first frequency translator having an input for the received radio frequency signal, an input for a local oscillator signal, and an output, a source of a tunable radio-frequency signal coupled to the input for the local oscillator signal, means for coupling the output of the first frequency translator to any one of a first plurality of bandpass filters. The second frequency-converting stage includes a second frequency translator having an input including a switch for selecting any of a plurality of the outputs of the final plurality of bandpass filters, an input for a local oscillator signal and an output, a by-pass path coupled to the switch to bypass the second frequency translator, a second source of a local oscillator signal coupled to the input for the local oscillator signal of the second frequency translator, means for selectively coupling the output of the second frequency translator or the output of the bypass path to a third frequency-converting stage. The third frequency translator has an input coupled to the means for selectively coupling, and input for a third local oscillator signal and an output. It further includes a plurality of third stage bypass paths coupling to the means for selectively coupling for bypassing the third frequency translator, and means for selectively transmitting the output of the third frequency translator or the output of any one of the plurality of the third stage bypass paths.

According to a specific implementation of our invention, the multiple use converter circuit employs a single tunable local oscillator which meets various requirements such as tuning step size, frequency switching speed and phase noise by employing two voltage-controlled-tunable oscillators in a double phase-locked loop plus selected associated divider circuitry following the double phase-locked loop. Furthermore, the frequency plan of the tunable local oscillator is closely coupled to the frequency plan of the first frequency converter stage such that a large percentage of common circuitry can be used for the tunable local oscillator while providing the proper tuning step size and short term frequency stability appropriate to each CNST function that is input to the first frequency converter stage. The need for proper tuning step size and short term frequency stability becomes further apparent from the detailed description hereinafter. This specific embodiment further employs a single, tunable, frequency converter that accepts the entire radio frequency input range of approximately 2 to 2000 MHz after it has been RF prefiltered external to our invention. The invention eliminates RF prefilters within this preferred frequency converter of our invention for all the CNI functions served. These RF prefilters can be tailored external to the intermediate frequency conversion locale for specific applications. Thus, it is possible to invest the available circuitry size and power of our frequency converter in the intermediate circuit filters. Still further, the use of multiple first-stage intermediate frequency filters is kept to a minimum and the greatest concentration of filtering in each signal path is done in the later intermediate frequency conversion stages which utilize a high degree of filter commonality among CNI functions.

While the preceding description of features appears to require a complex approach to actual implementation, we have discovered that complexity in the frequency plan is reduced by dividing the group of communication, navigation, and interrogation functions throughout the entire frequency band (e.g., 2 MHz to 2,000 MHz) into two categories generically termed wideband functions and narrowband functions, and then using the wideband IF filters, off-center, for filtering some of the narrowband functions.

Further features of the above-described intermediate frequency partitioning plan will become apparent from the detailed description hereinafter.

The foregoing features together with certain other features described hereinafter enable the overall system to have properties differing not just by a matter of degree from the prior art, but offering an order of magnitude more efficient use of circuitry and maintaining sufficient rejection of interference or of image responses and nonlinear responses created by such interference. This comparison holds for each level of circuit integration at which one may choose to make the comparison.

Additional features and advantages of the invention will be set forth in part in the description which follows, and in part will be obvious from the description, or may be learned by practice of the invention. The advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate preferred embodiments of the apparatus and method according to the invention and, together with the description, serve to explain the principles of the invention.

BRIEF DESCRIPTION OF THE DRAWINGS

FIGS. 8A,8B–16A,16B are showings of the signal flows through the embodiment of FIGS. 5A,5B for third through eleventh sets of radio-frequency input signals.

DETAILED DESCRIPTION

A wideband RF-to-IF multifunction receiver including a frequency converter according to the invention obtains improved utilization of installed circuitry by employing a single tunable frequency converter for any of the RF signals in the entire band, assuming that only a single conversion process is proceeding at any one time. To make this possible, the tunable frequency converter accepts any signal in the RF range of interest, approximately 2 MHz to 2000 Mhz, at a single tunable first frequency translator.

Further, multiple first intermediate frequencies are used (multiple first IFs). Several different output filters of different center frequencies and different bandpass widths are used for different types of input signals being converted. These filters plus the filters in the frequency translator stages that follow this first frequency translator comprise a minimal set (i.e., number) of filters that accommodate the frequency conversion of most CNST functions in the 2 Mhz to 2000 Mhz RF input range. However, this invention includes variations (obvious to those skilled in the art) of the center frequencies and bandpass widths of the various filters in all frequency translator stages that would still allow the passage of CNST signals through the frequency converter, yet with the same minimal number of filters. Also, one or more of the total number of filters in the frequency converter could be excluded by those skilled in the art with a predicted sacrifice in performance or a reduction in the number of CNST functions being accommodated.

Still further, the cases requiring different first intermediate frequencies and different first IF bandwidths are various CNST signals at different portions of the RF input range that require different first intermediate frequencies to avoid unacceptable passage through the frequency converter of interference co-existing with the desired signals at the input, or unacceptable image responses or spurious mixer products due to such interference at the input.

Still further, the special cases requiring a different first IF are certain narrowband RF input signals that would experience unacceptable spurious mixer products when converted to an IF that would be an optimum choice for most other types of input signals.

Figure 1:
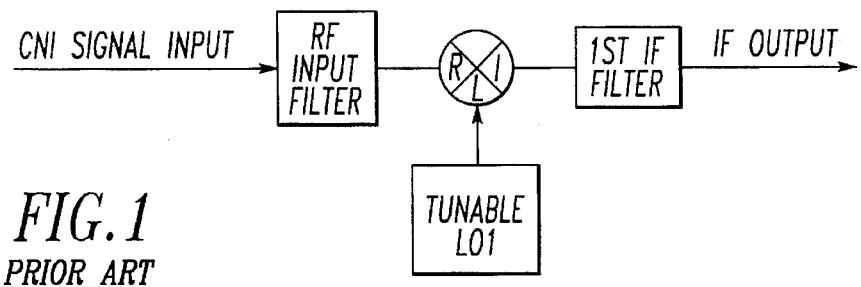
FIG. 1 is a block diagrammatic showing the simplest form of a typical prior art RF-to-IF frequency converter for a typical communication, navigation, or interrogation type function.
Figure 2:
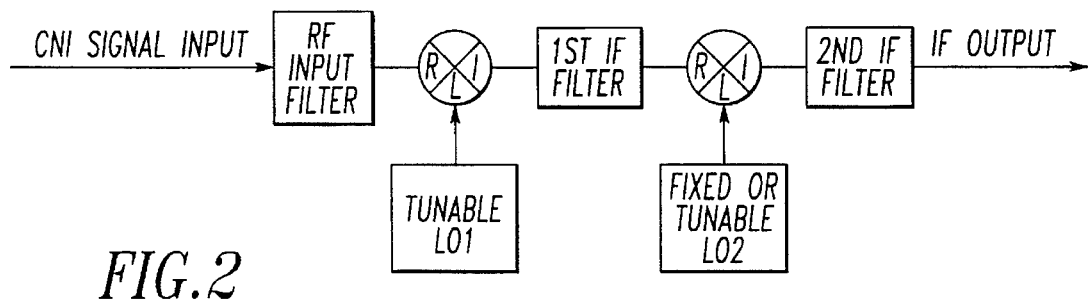
FIG. 2 is a block diagrammatic showing of a prior art variant of the showing of FIG. 1 to further suppress the level of interference-related undesirable responses.
Figure 3:
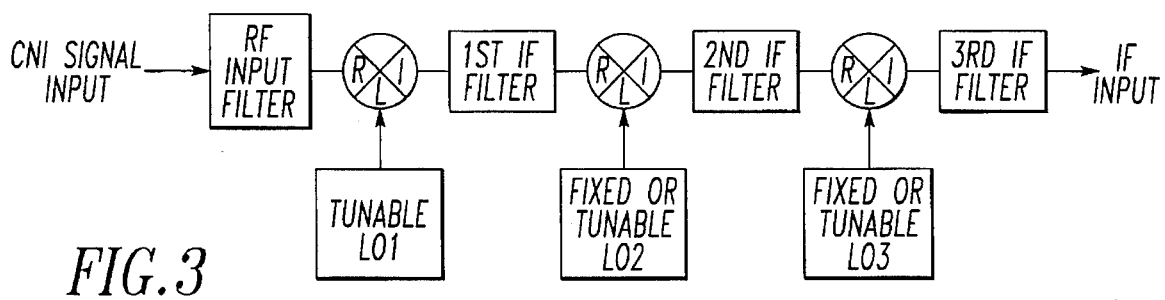
FIG. 3 is a block diagrammatic showing of a prior art variant of the showings of FIG. 1 and FIG. 2 to further suppress the level of interference-related undesirable signal responses.
Figure 4:
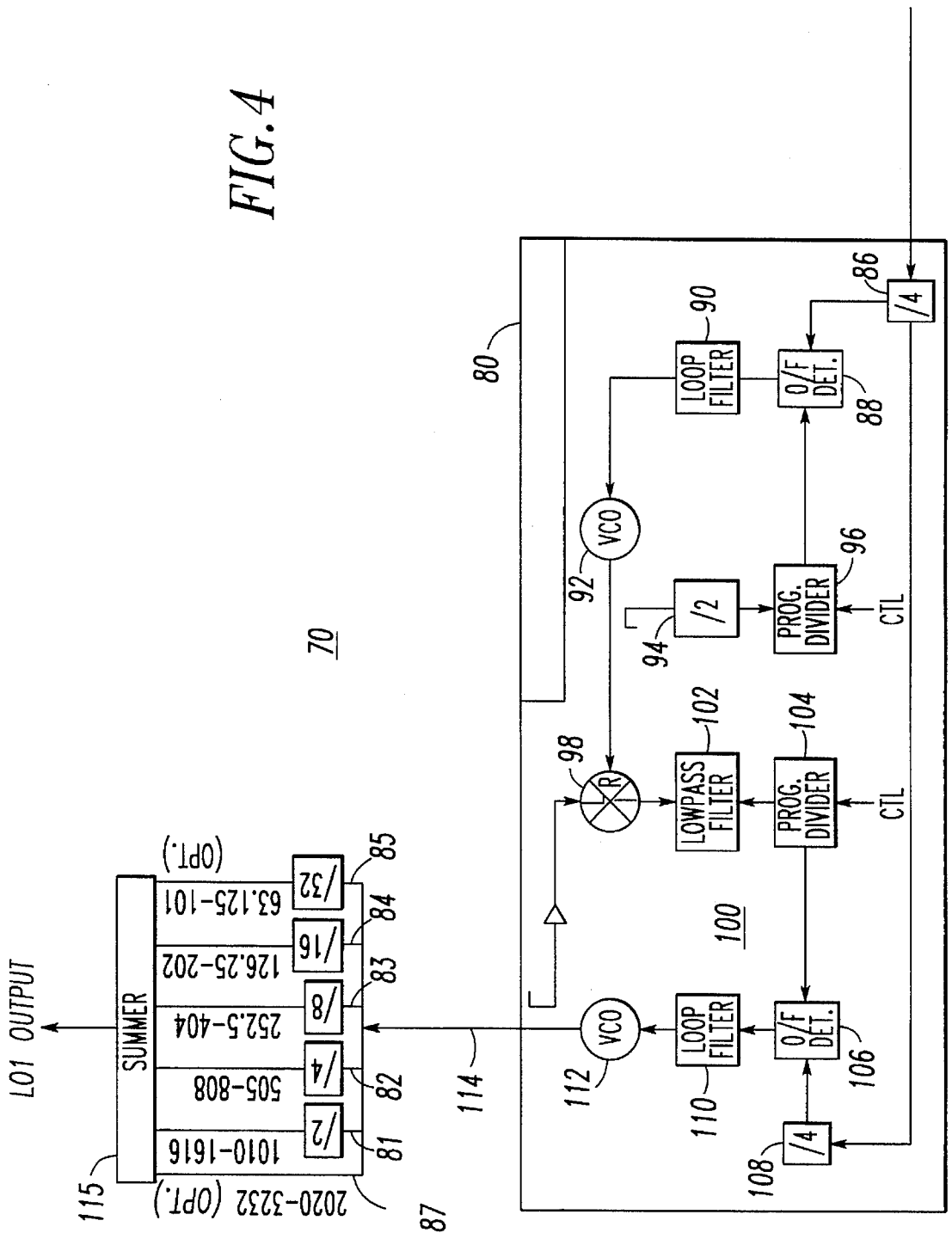
FIG. 4 is a block-diagrammatic showing of a double phase-locked loop for establishing the local oscillator tuning steps and tuning speeds for the preferred embodiment of the invention.
Figure 5A:
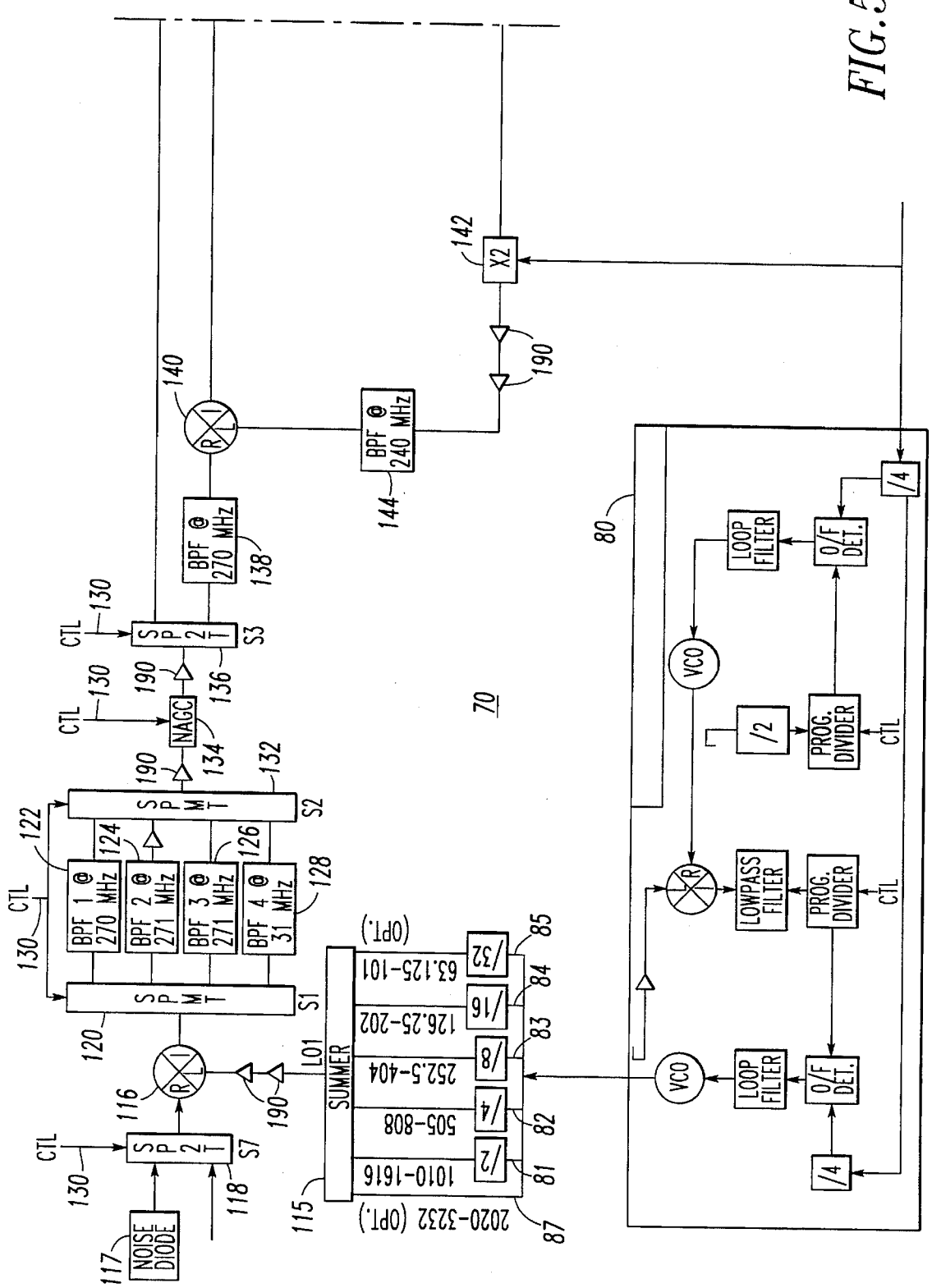
FIGS. 5A–5B is a block diagrammatic showing of the frequency conversion stages of an RF analog receiver according to the present invention.
Figure 5B:
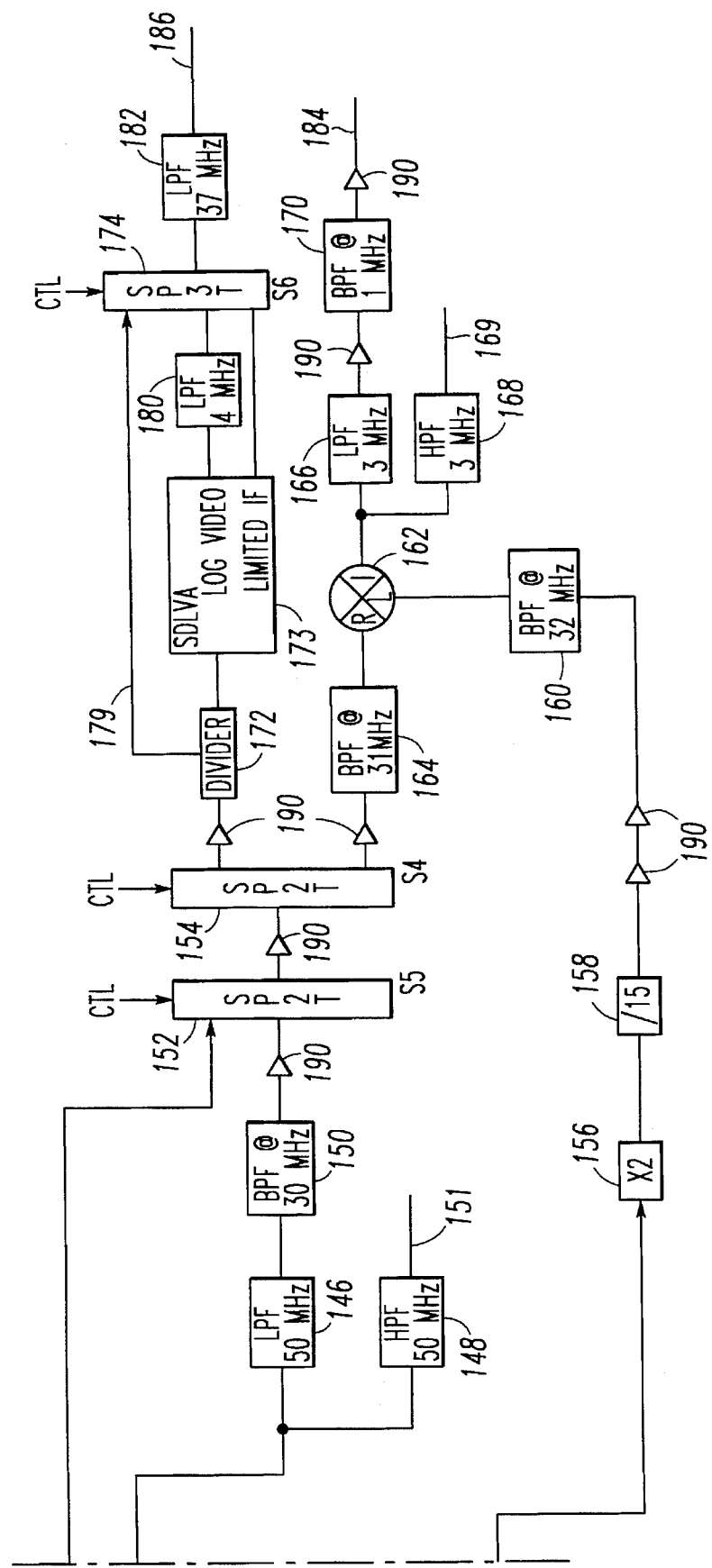

In FIG. 4, the double phase-locked loop synthesizer 80 of the oscillator circuitry 70, employed with the preferred embodiment of FIG. 5, is shown with typical output frequency divider circuits 81–85 and the straight-through path (i.e., no frequency division) 87.

A reference signal of 120 MHz is input to divide-by-four circuit 86, where the result is compared in phase-frequency detector 88 to a fed-back related signal. It passes through loop filter 90 to voltage controlled oscillator 92, where it synchronizes a stronger signal generated by VCO 92.

From voltage-controlled oscillator 92, a portion of the signal is passed through divide-by-2 circuit 94 and programmable divider 96 to supply the fed-back signal. The remainder of the signal from oscillator 92 passes to mixer 98 in fine loop 100, where it is mixed with a portion of the output of synthesizer 80. One sideband is passed by low-pass filter 102 to programmable divider 104, and thence to phase/frequency detector 106, where it is compared to a signal related to the reference signal, as processed by divide-by-four circuits 86 and 108. The result passes through loop filter 110 and synchronizes voltage-controlled oscillator 112, to provide the output signal 114 of synthesizer 80.

In the preferred embodiment of FIG. 5, the oscillator circuitry 70 of FIG. 4 provides a tunable local oscillator signal L01 to the single tunable frequency translator 116, where it is mixed with the current RF input signal passed by single-pole, double-throw switch 118. The resulting intermediate frequency is passed by single-pole, multiple-throw switch 120 to one of band pass filters 122, 124, 126 and 128 appropriate to the relevant communication, navigation, or interrogation function as determined by control 130 (not shown in detail).

In an alternate mode of operation, the signal from noise diode 117 is passed as a test signal by the single-pole double-throw switch 118 through the remainder of the frequency converter.

It is of interest to note at this point that the bandpass filter 122 for the intermediate frequency of 270 MHz is a filter for the relatively wideband signals derived from relatively wideband input RF signals. The bandpass filter 124 for the intermediate frequency of 271 MHz is a filter for one of the relatively narrow band signals derived from particular groups of relatively narrow band input RF signals. The bandpass filter 126 for the intermediate frequency of 271 MHz is a filter for one of the moderate band signals derived from particular groups of relatively moderate band input RF signals. The differences of the center frequencies, for respective intermediate frequencies 271 MHz and 270 MHz, are uniquely related to certain properties of the second intermediate frequencies obtained following second frequency translator 140. Bandpass filter 128 filters a signal intended to bypass second frequency translator 140 and is a filter at a different first IF to achieve interference-related performance for various CNST functions whose radio frequencies fall within certain portion of the 2 Mhz to 2000 Mhz input RF range and which functions could not achieve the necessary interference-related performance at the first IF associated with the filters 122, 124 or 126.

The passband of filters associated with all frequency converter stages in our frequency converter takes into account the tuning step size granularity of the first tunable local oscillator in each tuning band, and such filter passbands are wide enough to pass this tuning granularity plus the various CNST signals, yet are narrow enough to reject undesirable signals, such undesirable signals including either radio frequency interference co-existing with the desired signals at the input, image signals created at each frequency conversion stage by co-existing radio frequency interference, undesirable signals generated within various stages of our wideband radio frequency converter due to co-existing radio frequency interference interacting with circuit nonlinearities, or unwanted sidebands generated at the various frequency conversion stages.

Also, an additional feature of our invention is that the largest tuning step sizes (obtained via the smaller division ratios such as divide-by-2 and divide-by 4 after the double phase-locked loop) are employed mostly for CNST functions whose center frequencies after the first frequency translation can be made to fall exactly on the center frequencies corresponding to the various first IFs, regardless of the tuning step size granularity. For these CNST functions the bandwidth of the first IF filters need not be increased to account for local oscillator tuning step size granularity, which results in better rejection of undesirable interference-related signals.

Single-pole multiple-throw switch 132, which mirrors single pole, multiple-throw switch 120 so that any of the processed signals passes through noise AGC 134, and through single-pole double-throw switch 136 to the second intermediate frequency-conversion stage including frequency translator 140 and the input bandpass filter 138. The width of the pass band of band pass filter 138 is sufficiently great on account of being able to pass a wideband signal centered at 270 MHz that is more than adequate to pass the relatively narrowband signals centered at 271 Mhz.

The noise automatic gain control (AGC) 134, illustratively in conjunction with an amplification variation built into some of the amplifiers 190, is utilized to set the level of the thermal noise associated with the signals of interest at the IF outputs 184 and 186.

Importantly, each frequency translator after the first one, i.e., after frequency translator 116, employs a fixed local oscillator signal instead of a tunable local oscillator signal. Tuning at only a single frequency translator, i.e., the first frequency translator, simplifies tuning synchronization for the entire frequency converter when switching frequencies. Thus, frequency translator 140 illustratively receives a fixed 240 MHz local oscillator signal for mixing with all input signals except the group of narrow band signals designated for bypassing the second frequency translator 140. This local oscillator signal is transmitted from the reference signal source via frequency doubler 142 and bandpass filter 144. Frequency translator 140 thus reduces overall circuitry because it doubles as the middle frequency translator stage in a triple-conversion mode of the frequency converter, and as the last frequency translator stage when switch 154 bypasses the third frequency translator and routes the signal to the wideband output paths.

Setting aside consideration of filters 146 and 148 at this point, it is seen that bandpass filter 150 may have enough bandwidth to pass the wideband signals, which will be centered at 30 MHz and still have more than enough bandwidth to pass the relatively narrowband signals centered at 31 MHz, i.e., those originally passing through bandpass filters 124 and 126. Thus, bandpass filter 150 reduces overall circuitry because it doubles as a filter in both the wideband and narrowband paths. In an alternate implementation (not shown) filter 150 may be placed after switch 154 in the wideband (top) path. Also, for special applications, the bandwidth of the filter 150 can be changed or one or more other filters of same center frequency but different bandwidths can be added in parallel via a switching arrangement (also not shown) to tailor interference-rejection performance for various wideband CNST functions.

The diplexer combination of filters 146 and 148, plus RF load 151, are utilized to present a good impedance match to the frequency translator 140.

Single-pole, double-throw switch 152 mirrors switch 136 and passes all received signals to single-pole, double-throw switch 154, which transmits the signals to the third frequency translator.

Importantly, the local oscillator signal for the third stage is a fixed frequency derived from the reference frequency by passing through frequency doublers 142 and 156 and divide-by-15 circuit 158 and is applied to frequency translator 162 via bandpass filter 160. Alternatively, to reduce circuitry at the expense of slightly reduced performance, the local oscillator signal could be changed to 30 Mhz, which eliminates frequency doubler 152 and divide-by-15 circuit 158 and replaces them with the simpler divide-by-4 circuit (not shown).

Switch 154 sends all of the 31 MHz signals, both those that bypassed the second stage and those passed therethrough, through bandpass filter 164 to frequency translator 162, which ultimately yields 1 MHz output signals at the 1 Mhz IF output 184 retaining the respective bandwidths. Thus, frequency translator 162 reduces overall circuitry because it doubles as both the third frequency translator stage and the second frequency translator stage when the second frequency translator 140 is bypassed.

The diplexer combination of filters 166 and 168 plus RF load 169, are utilized to present a good impedance match to the frequency translator 162.

Further, switch 154 acts to bypass certain relatively wideband signals around the third frequency translator as needed on account of signal bandwidth.

The divider 172, in conjunction with control 130 (not shown in detail) and switch 174 pass selected wide signal bandwidth signals through the 30 Mhz linear bypass path 179, whereby said selected signals are passed without undue phase and amplitude distortion through low pass filter (LPF)182 to the 30 Mhz IF output 186.

Similarly, divider 172, in conjunction with control 130 (not shown in detail) and switch 174 pass selected wide signal bandwidth signals of highly variable signal levels through the detected logarithmic video path of the sequential detection log video amplifier (SDLVA) 173 and through low pass filter (LPF) 180, whereby such selected signals are passed without phase information, but with logarithmic amplitude, through low pass filter (LPF) 182 to the 30 Mhz If output 186.

Similarly, divider 172, in conjunction with control 130 (not shown in detail) and switch 174 pass selected wide signal bandwidth signals of highly variable signal levels through the limited IF path of the sequential detection log video amplifier (SDLVA) 173 whereby such selected signals are passed with limited amplitude but with phase information through low pass filter (LPF) 182 to the 30 Mhz IF output 186.

The plurality of amplifiers 190 are used at various points in the circuitry to maintain signal level. The indicated placement of these amplifiers in the figures are shown as examples and, dependent upon the losses associated with various circuit components, those skilled in the art can determined the amplification and placement of these amplifiers. Furthermore, the amplification of some or all of these amplifiers can be made variable subject to external control (not shown in detail) to adapt performance to various levels of interfering signals and desired signals at the RF input to the frequency converter.

While the foregoing description mentions specific frequencies, it does so by way of example only. Various rearrangements of frequencies are feasible according to the principles of the invention. For example, one could set the final IF higher and work backward from there.

Moreover, the adaptability of the above-described arrangement is very great.

One way of demonstrating the larger number of different types and requirements of signals that may be processed through the embodiment of FIG. 5 is to follow examples of signal flow therethrough.

In FIGS. 6–16, various types of RF input signals corresponding to different types of communication, navigation and interrogation applications are traced through the embodiment of FIG. 5. These showings are examples that demonstrate the wide-ranging applicability of the invention.

EXAMPLE 1

Figure 6A:
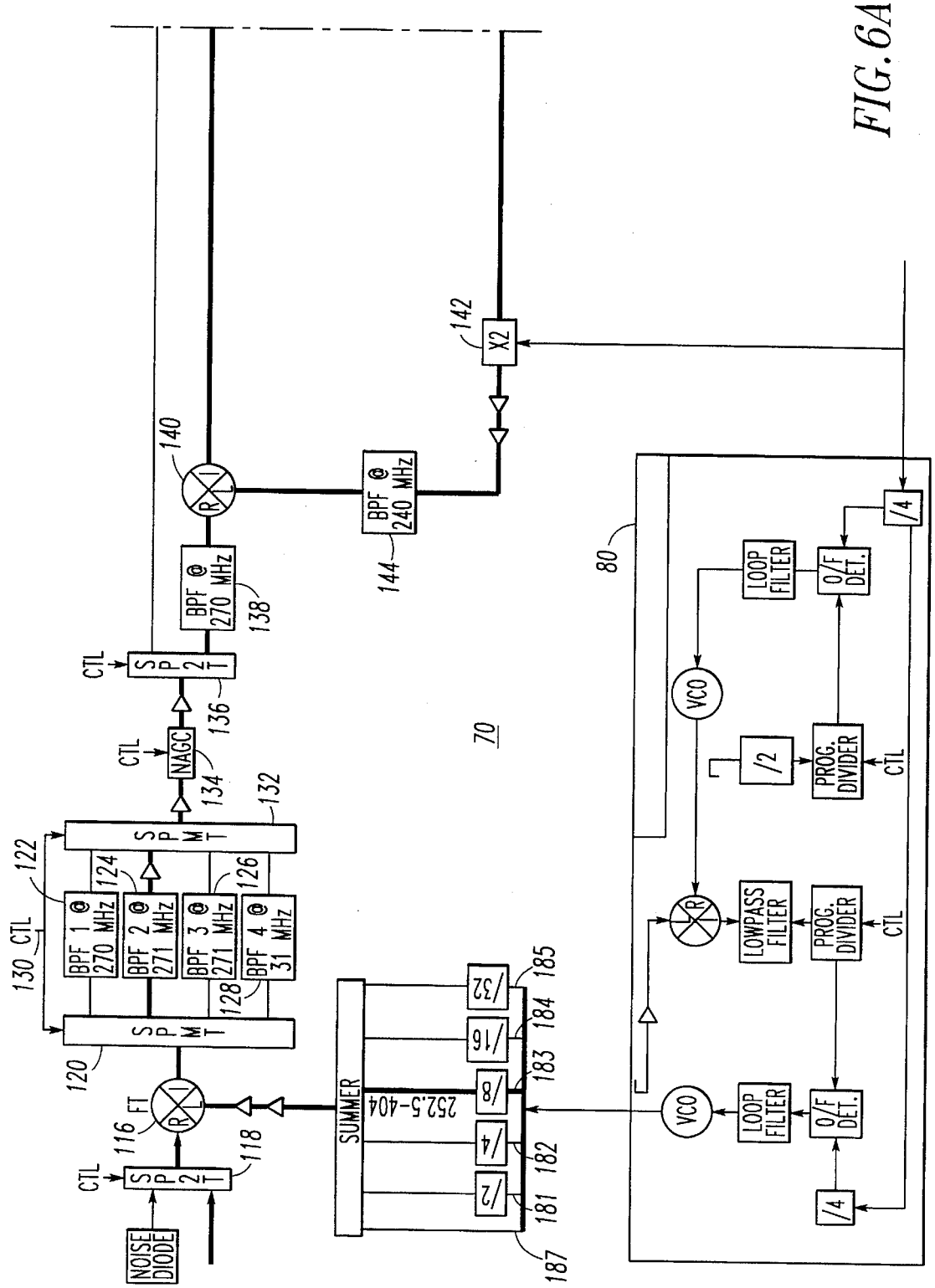
FIGS. 6A–6B is a showing of the signal flow through the embodiment of FIG. 5A–5B for a first set of input signals.
Figure 6B:
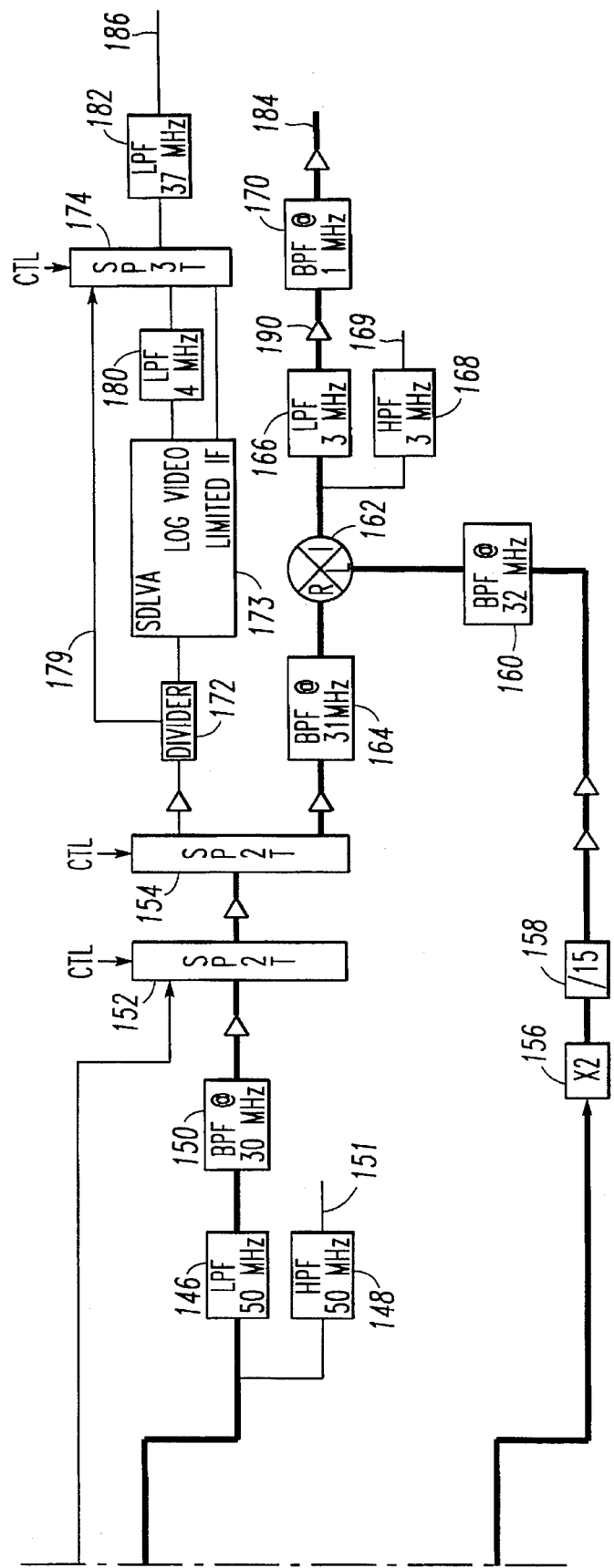

In FIG. 6, Example 1 includes the frequency conversion in the embodiment of FIG. 5 of all high-frequency (HF) 1.5–30 MHz communications, Citizens Band signals, all 30–88 MHz VHF signals, an ILS Marker Beacon at 75 MHz, and 88–108 VHF FM broadcast signals. Switch 130 directs such input signals to frequency translator 116. The tunable local oscillator signal from oscillator circuitry 70 is tuned to a corresponding signal in the 252.6 MHz to 404 MHz range so that bandpass filter 124 passes a signal centered at 271 MHz. Bandpass filter 124 has been switched into the circuit by switches 120 and 132 in response to control 130.

Example 1 and the examples to follow illustrate the important interrelationship between the frequency plan implementation of the oscillator circuitry 70 and the RF/IF frequency plan for the first frequency translator 116. CNST functions in the lower RF input ranges (i.e., below approximately 500 Mhz) require smaller tuning step sizes and superior short term frequency stability performance from the tunable local oscillator 70. The composite frequency plan of the first frequency translation stage 116 and the oscillator 70 has been arranged such that the oscillator utilizes a larger division ratio (equal to 8 in this example) which produces an acceptable small tuning step (62.5 Khz in this case) and acceptable short term frequency stability. (Short term frequency stability performance improves as the division ratio following the double phase-locked loop synthesizer 80 is increased.)

Switch 136 is correspondingly connected to bandpass filter 138, as there is no 31 MHz signal to be bypassed at the frequency translator 140. Since all of the subject signals are basically narrowband signals, 270 MHz bandpass filter 138 has sufficient bandwidth to pass this narrowband signals at a 271 MHz center frequency, previously produced in frequency translator 116.

A fixed frequency local oscillator signal of 240 MHz at frequency translator 140 produces an output frequency of 31 Mhz. The passband of filter 150, centered at 30 MHz, is wide enough to pass this narrow band traffic centered at 31 MHz.

In the third intermediate frequency-converter stage, frequency translator 162 receives the signal at 31 MHz and the fixed local oscillator frequency at 32 MHz to produce the final output centered at an IF of 1 MHz.

EXAMPLE 2

Figure 7A:
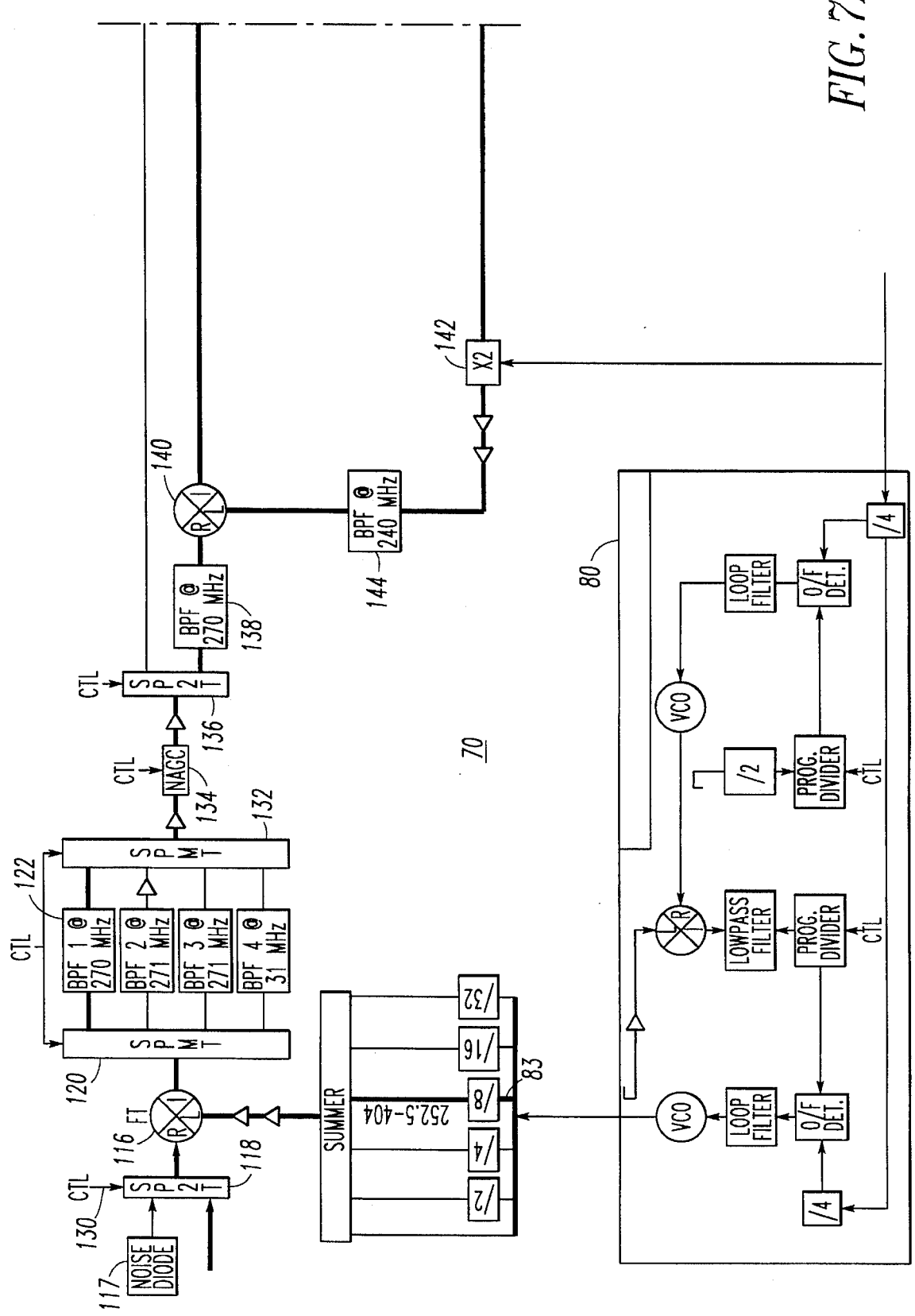
FIGS. 7A–7B is a showing of the signal flow through the embodiment of FIG. 5A–5B for a second set of input signals.
Figure 7B:
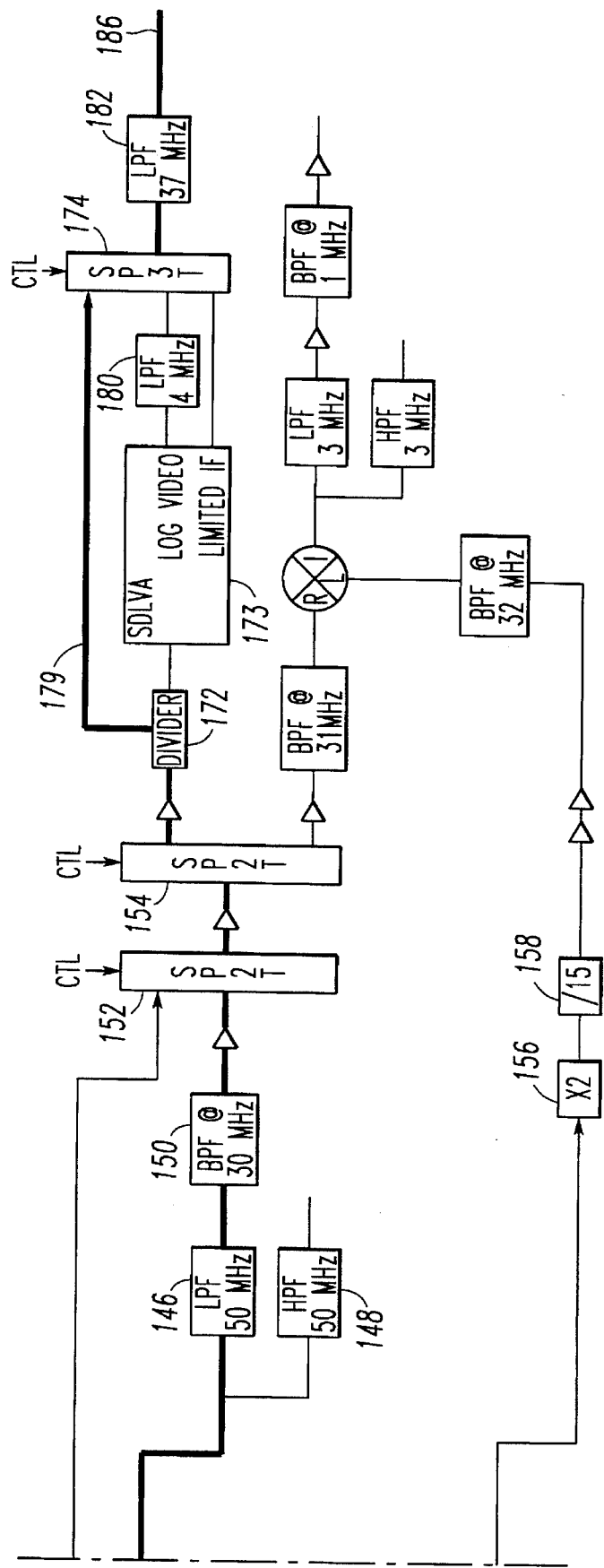

In FIG. 7, the operation of the embodiment of FIG. 5 for Example 2 is explained. Example 2 involves as the input signals any signals of commercial VHF TV broadcast.

The path of these signals, treated as a broad band signal by control 130, differs from that of Example 1 in that broadband bandpass filter 122 is switched into the circuit. Passage through the second IF stage ostensibly utilizes the bandwidths of filters 138 and 150. Switch 154, in response to control 130, directs the result to the upper branch of the third IF stage, where divider 172 sends the signals over the 30 MHz linear bypass through switch 174 to the 30 MHz IF output.

EXAMPLE 3

Figure 8A:
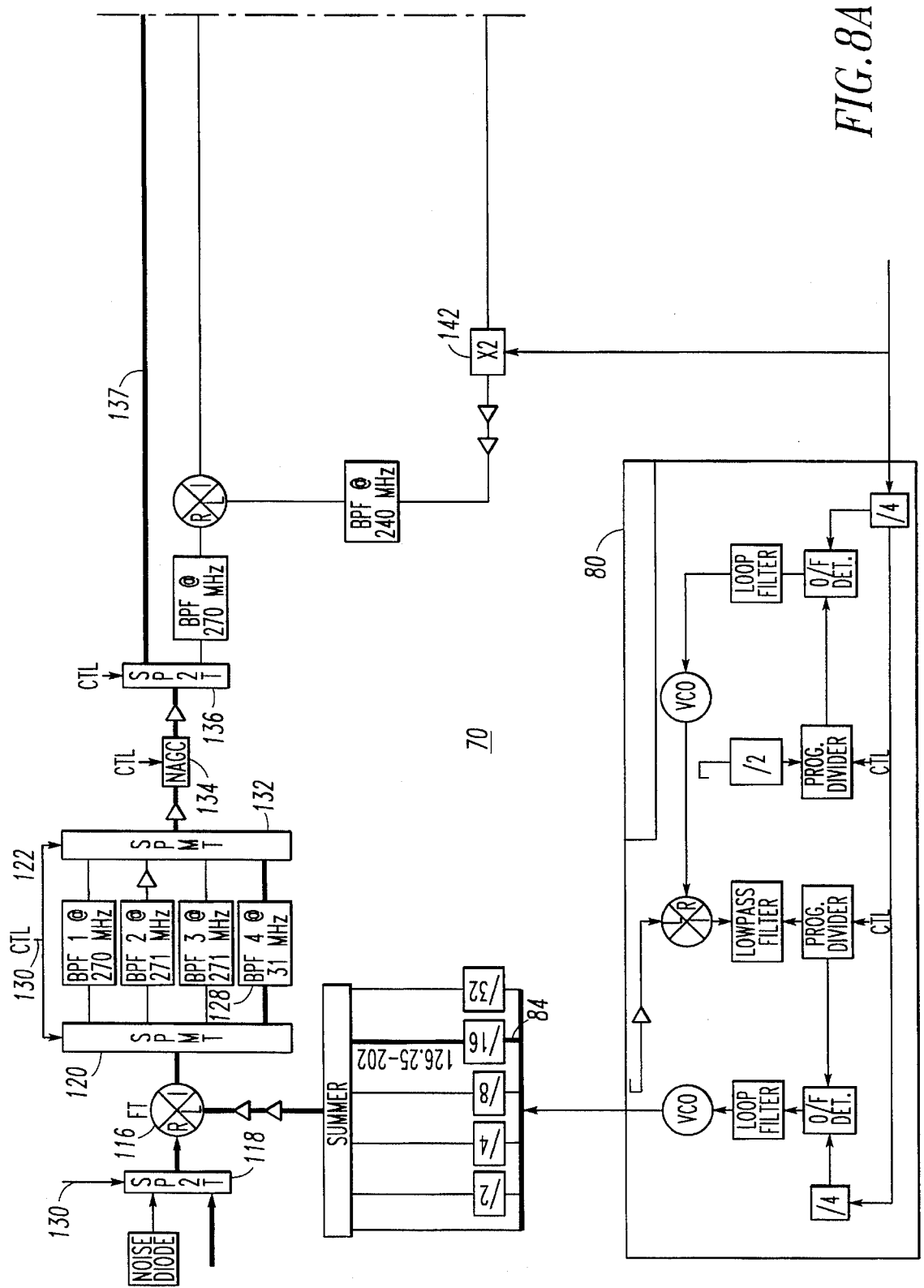
Figure 8B:
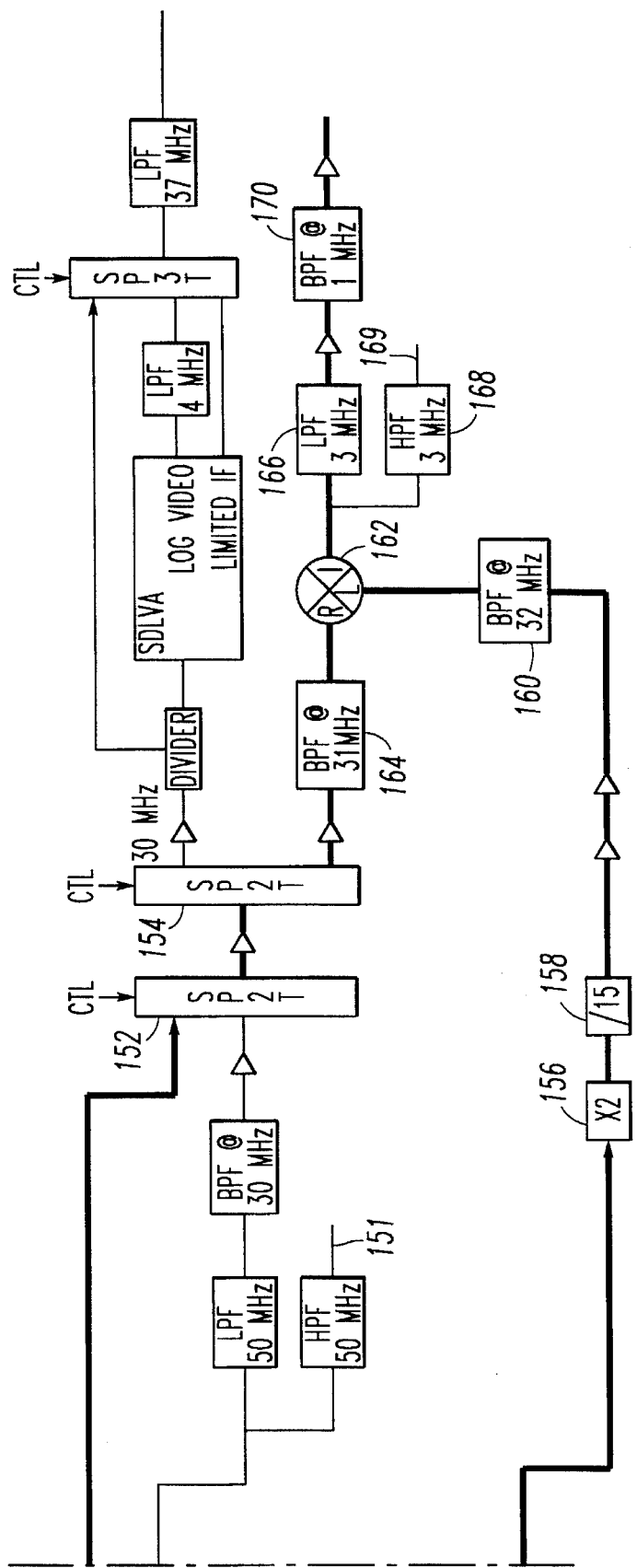

In FIG. 8, Example 3 involves some navigational type signals, as well as others in the 95.25 MHz to 233 MHz range. For example, included are ILS Localizer signals at 108–112 MHz, Very High Frequency Omni Range at 108–118 MHz, all VHF communications at 118–174 MHz, and ILS Glideslope.

In this example, a tunable local oscillator signal at a frequency in the range from 126.25–202 MHz is supplied from oscillator circuitry 70 to produce a first immediate frequency of 31 MHz, which is then passed through band pass filter 128. Control 130 and switch 136 then direct these signals to the 31 MHz bypass of the second IF stage. They are directed by switches 152 and 154 to bandpass filter 164 to produce the final IF output, after shifting by frequency translator 162 to a frequency centered at 1 MHz.

Similar to Example 1, Example 3 illustrates the important interrelationship between the frequency plan implementation of the oscillator circuitry 70 and the RF/IF frequency plan for the first frequency translator 116. CNST functions associated with this function require the smallest tuning step sizes and better short term frequency stability performance from the tunable local oscillator 70 than that achieved in Example 1. The composite frequency plan of the first frequency translation stage 116 and the oscillator 70 has been arranged such that the oscillator utilizes the largest division ratio (equal to 16 in this example) which produces the smallest tuning step (31.25 Khz in this case) and better short term frequency stability than that achieved in Example 1. Furthermore, additional reduction in tuning step size (to 15,625 Khz) and improvement in short term frequency stability can be achieved for CNST functions falling in the 97–132 RF input range by employing a divide-by-32 divide circuit after the oscillator 70.

EXAMPLE 4

Figure 9A:
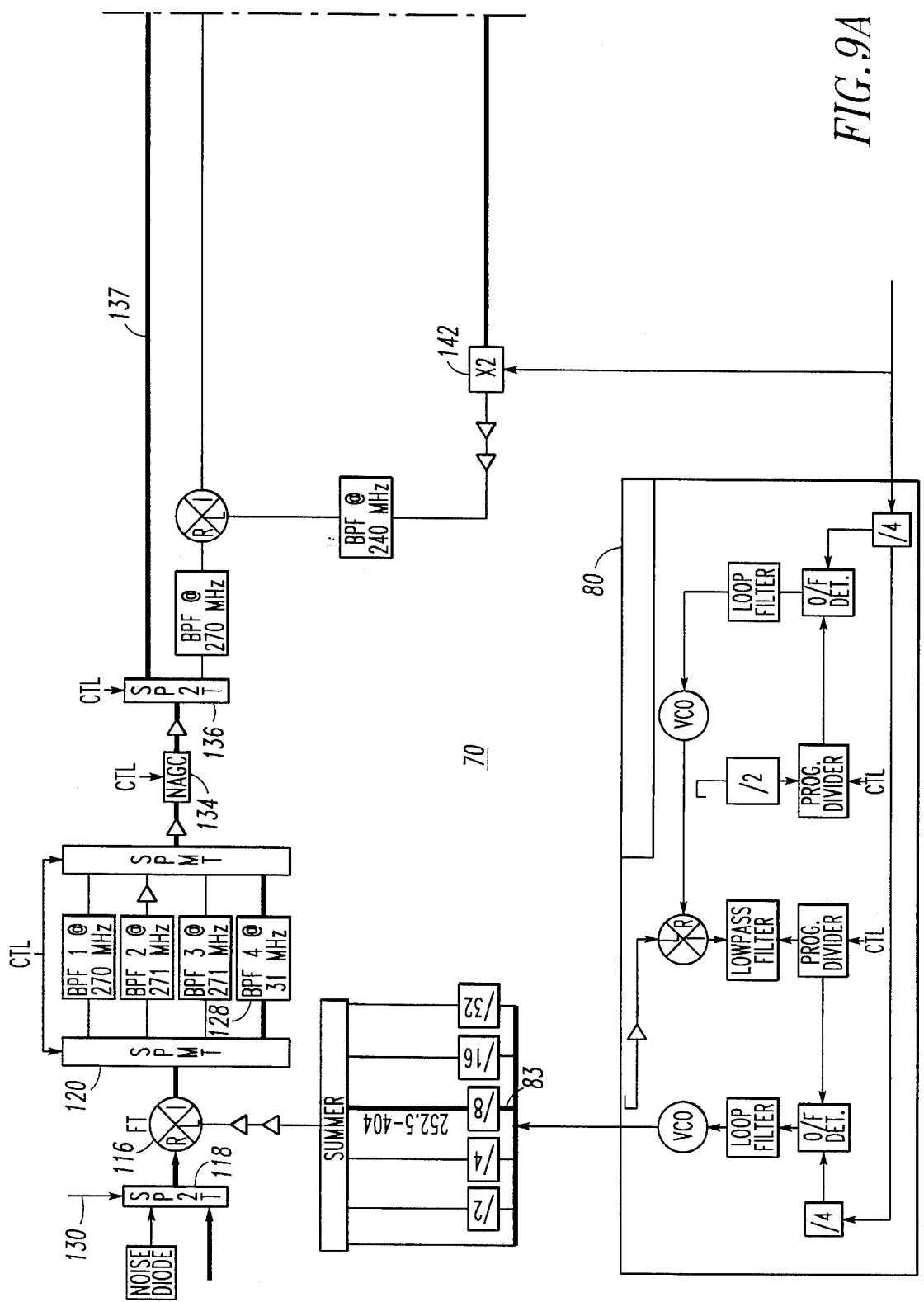
Figure 9B:
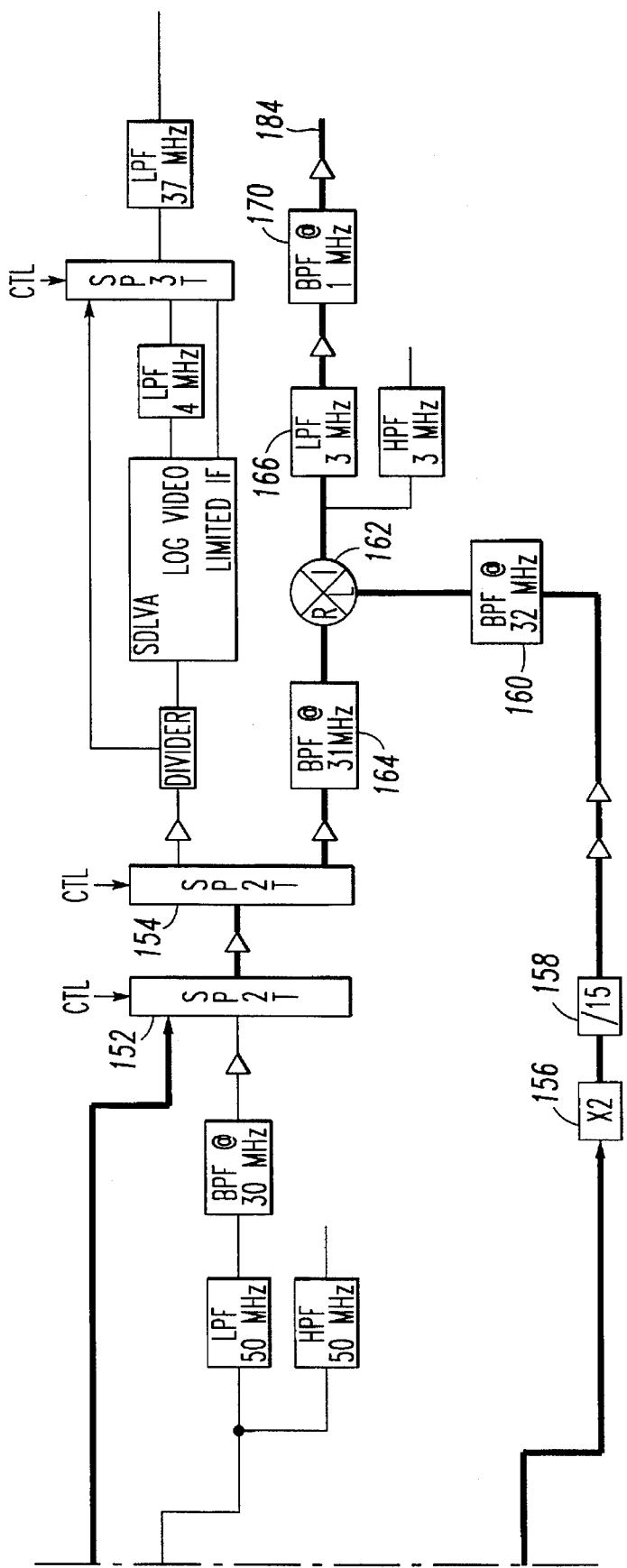

In FIG. 9, Example 4, providing a path similar to that of Example 3, except for using a different local oscillator output, at a frequency in the range from 126.25 MHz to 202 MHz, processes all RF signals in the range from 221.5–435 MHz, including all UHF communications in that range, including AM and FM, "HAVE QUICK", UHF SATCOM, and ILS Glideslope in that range. Again, the final IF output is centered at 1 MHz.

EXAMPLE 5

Figure 10A:
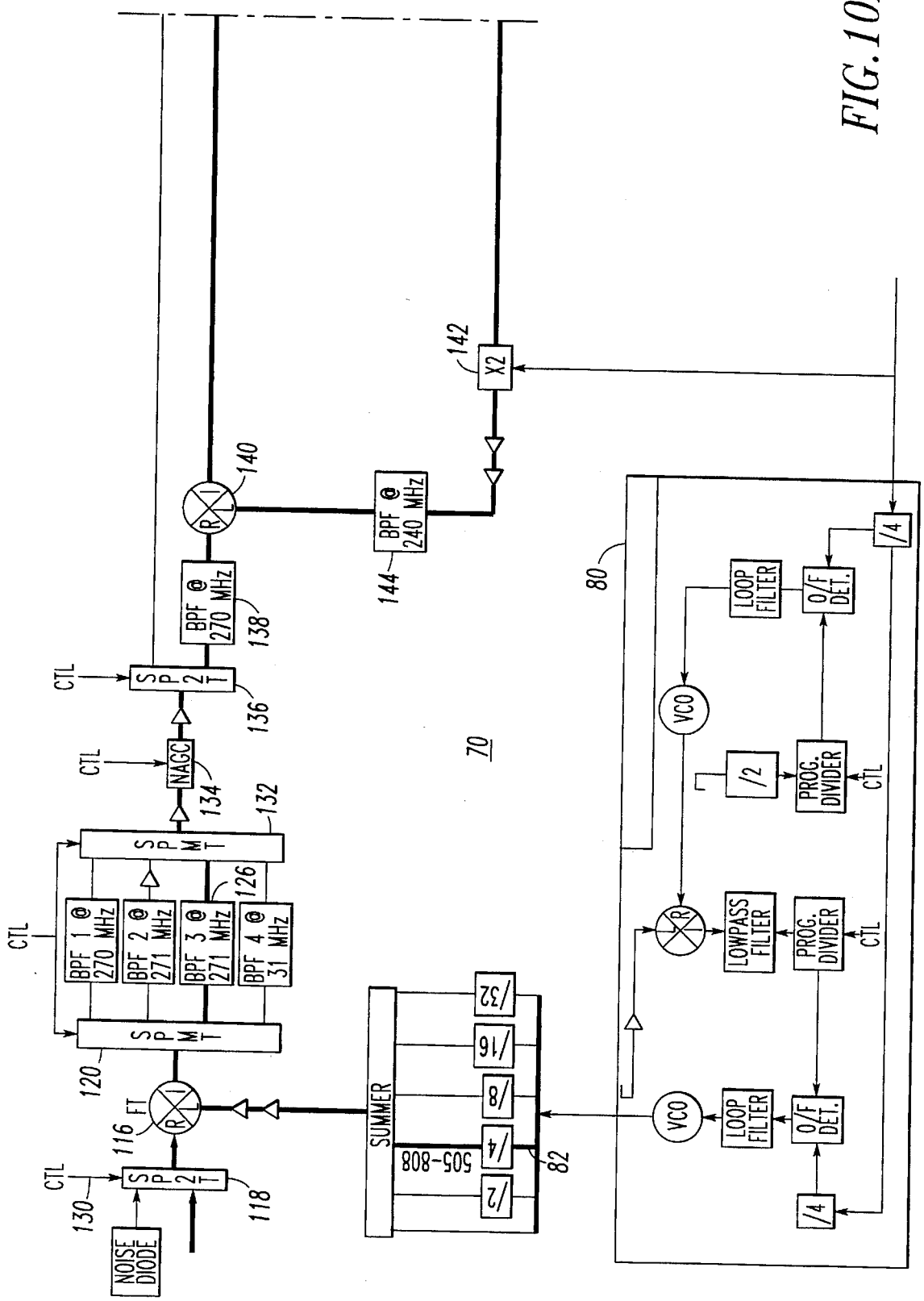
Figure 10B:
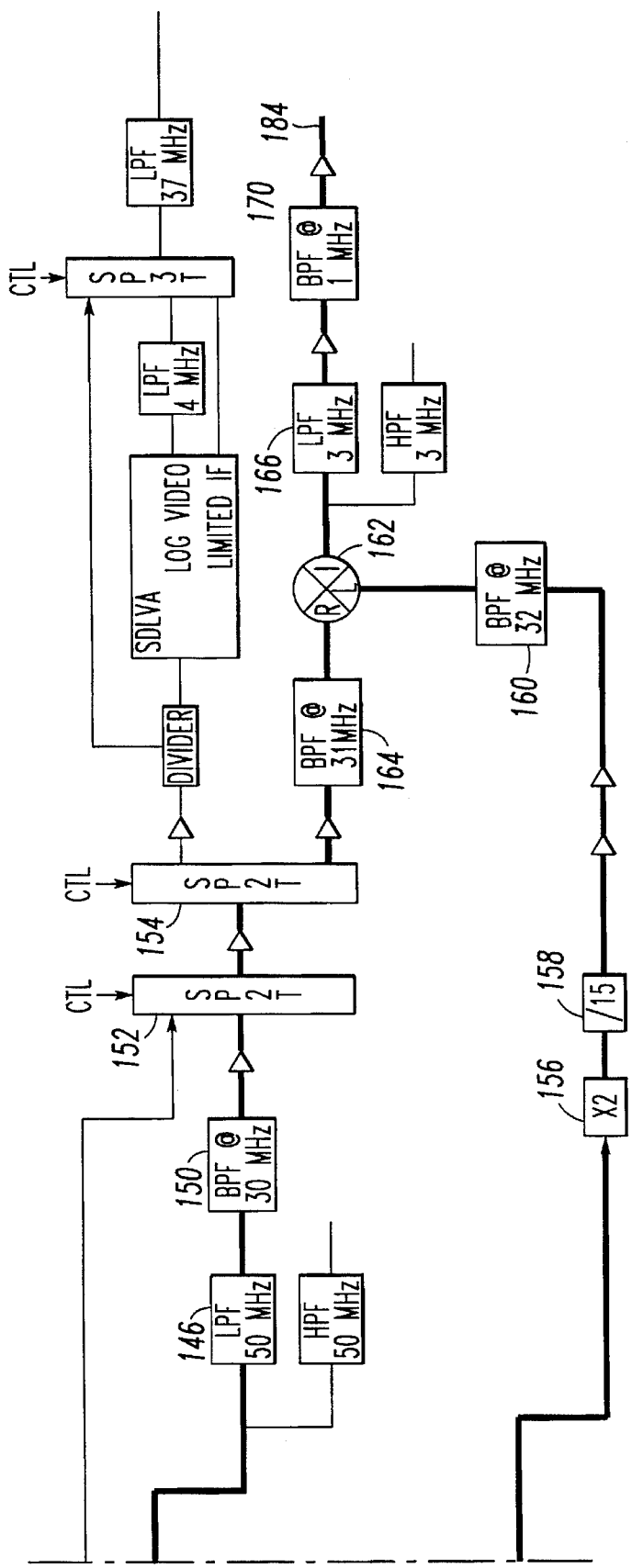

In FIG. 10, Example 5 frequency converts the listed RF input signals in the 234–537 MHz range. By using a tunable local oscillator output at a frequency in the range from 505 to 808 MHz, a relatively narrowband first IF of 271 MHz is obtained. Accordingly, bandpass filter 126 is used instead of like center frequency, narrowband filter 124. The passbands of filters 138 and 150 are still adequate to handle this traffic; and a result similar to that obtained in Example 1 is obtained.

Example 5 covers approximately the same input frequency range as Example 4, and illustrates an alternate RF/IF combination for frequency conversion of the same CNST functions as given in Example 4. Although the frequency tuning step size is twice as great as that given in Example 4, and the short term frequency stability is somewhat less than that achieved in Example 4, the alternate implementation of Example 5 sometimes offers improved interference-related performance relative to Example 4 and can be achieved without additional circuitry.

Moreover, Example 5 through Example 11 illustrates CNST functions whose RF center frequencies are such that after the first frequency translation in frequency translator 116 the signal frequency can be made to fall exactly in the center of the first IF, regardless of the tuning step size granularity, which, therefore, does not require the first IF filter passband to be widened to account for such granularity. Eliminating the need for widening the IF filter passband to account for tuning step size granularity is important in Example 5 through Example 11 because of the relatively wider tuning step sizes in these examples.

EXAMPLE 6

Figure 11A:
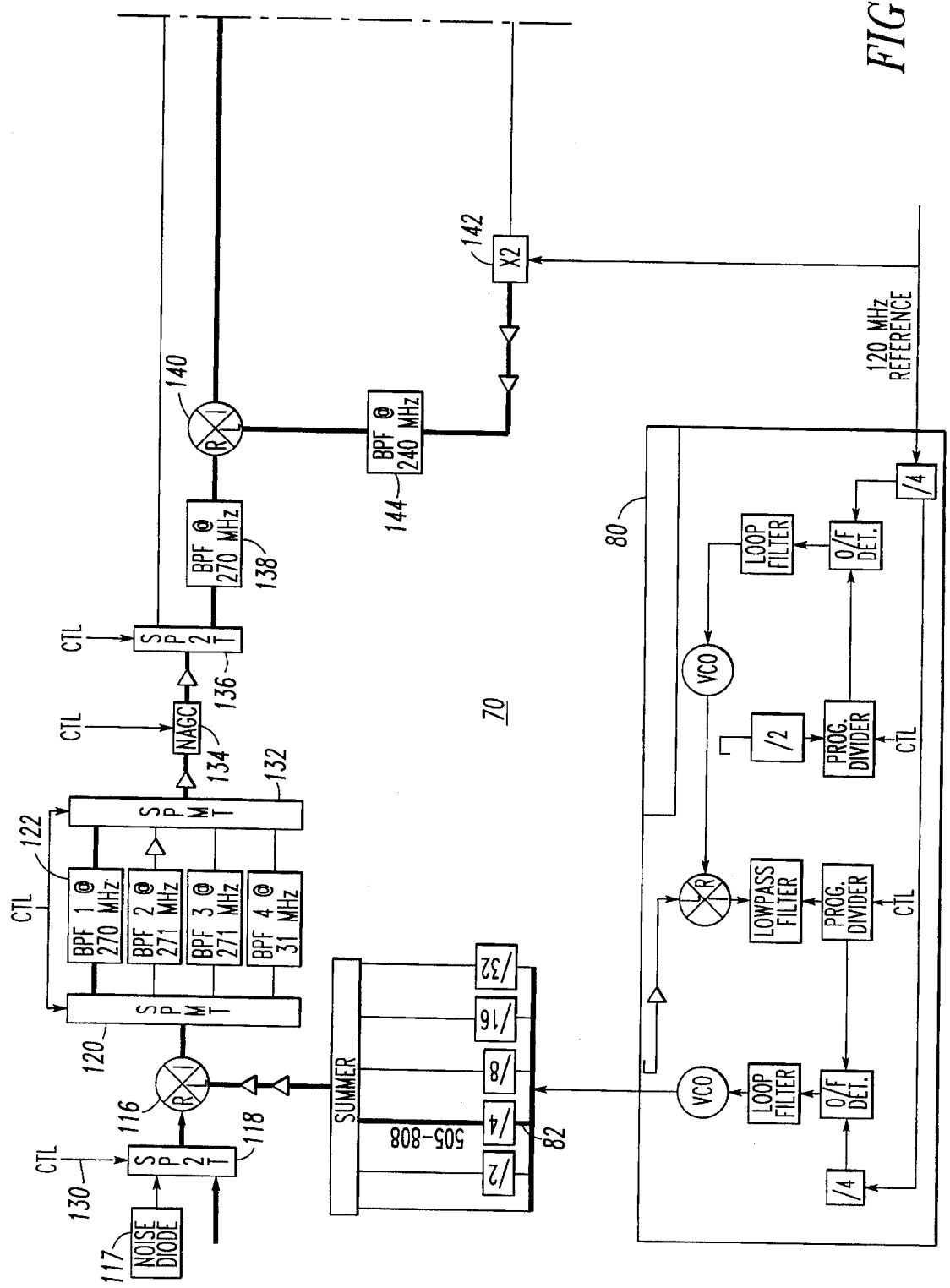
Figure 11B:
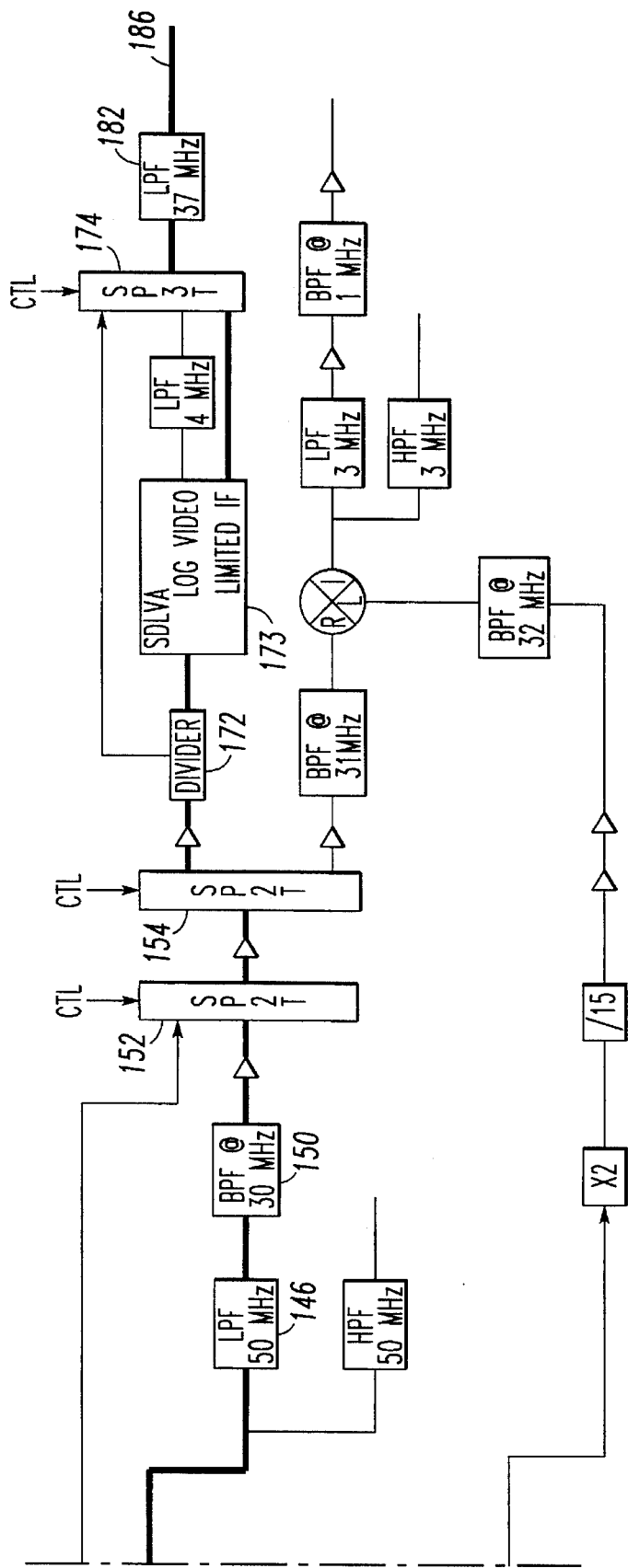

In FIG. 11, in Example 6, a broader bandwidth set of signals than in Example 5 are processed. They are in nearly the same RF frequency range, in this case 235–538 MHz, and include commercial UHF TV and Position Location Reporting System, use the same tunable local oscillator, but produce an IF of 270 MHz and are sent through bandpass filter 122. The resulting signals are on center with respect to filters 138 and 150 and are sent through the output branch 173 of divider 172, producing a final IF output centered at 30 MHz.

EXAMPLE 7

Figure 12A:
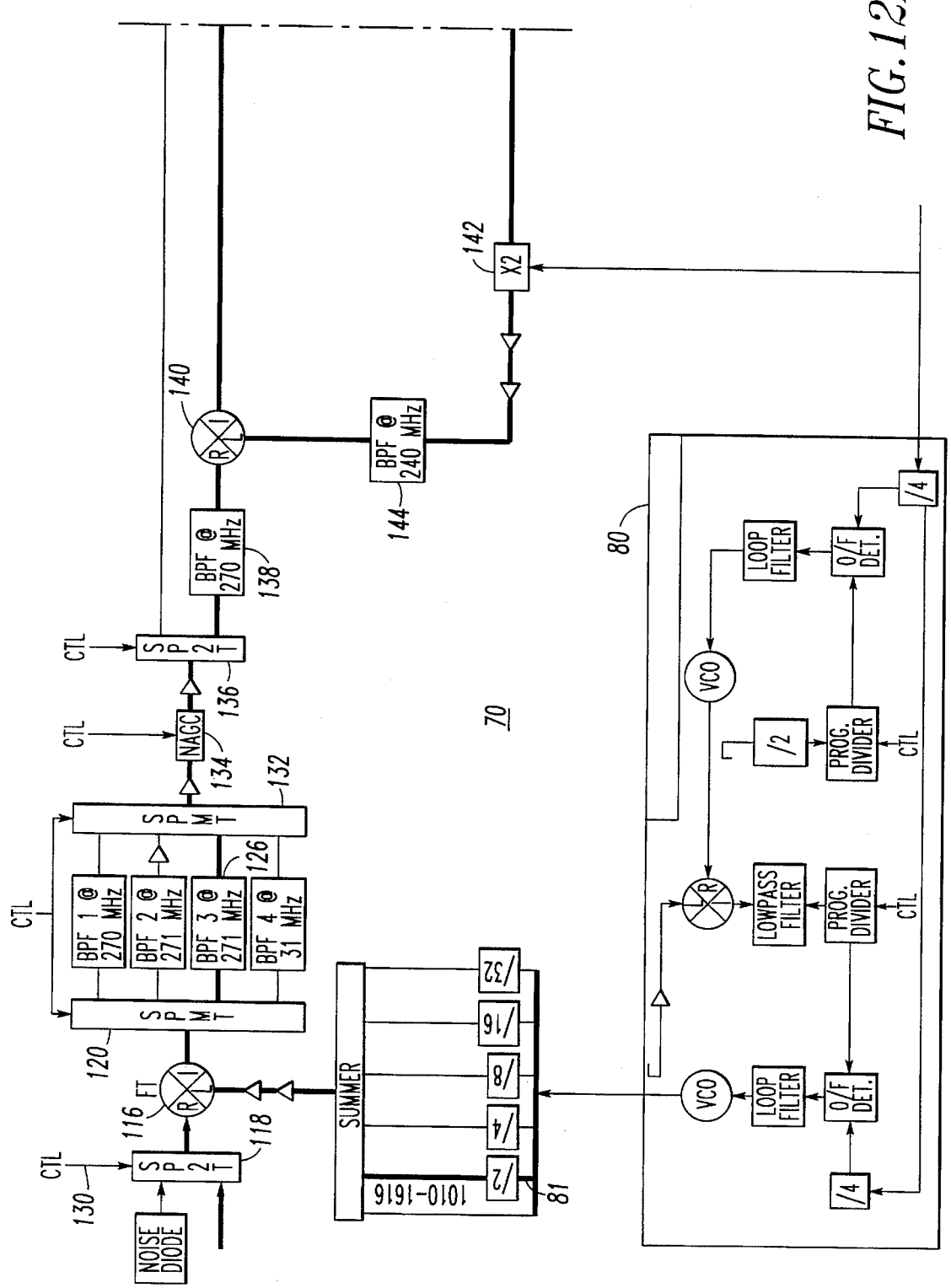
Figure 12B:
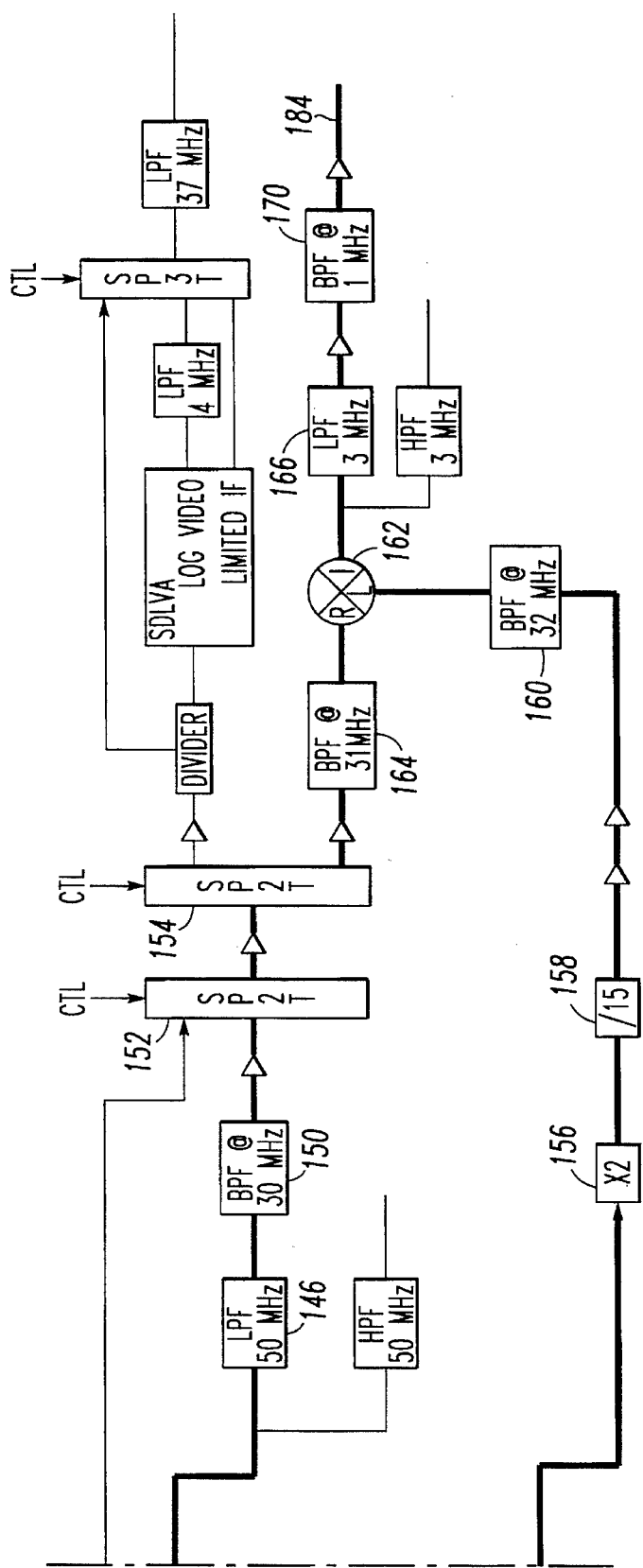

In Example 7, FIG. 12, higher frequency specialized mostly relatively narrowband signals are frequency-converted. They include various commercial and public safety communications, as listed on FIG. 12, and also include Tactical Air Navigation (TA-CAN) and Distance Measuring Equipment/Normal (DME/N). This example is similar to Example 5 of FIG. 10, except for the very much higher frequencies involved here. The tunable local oscillator signal from oscillator circuitry 70 has a frequency in the range from 1010 MHz to 1,616 MHz. final IF centered at 1 MHz is produced.

EXAMPLE 8

Figure 13A:
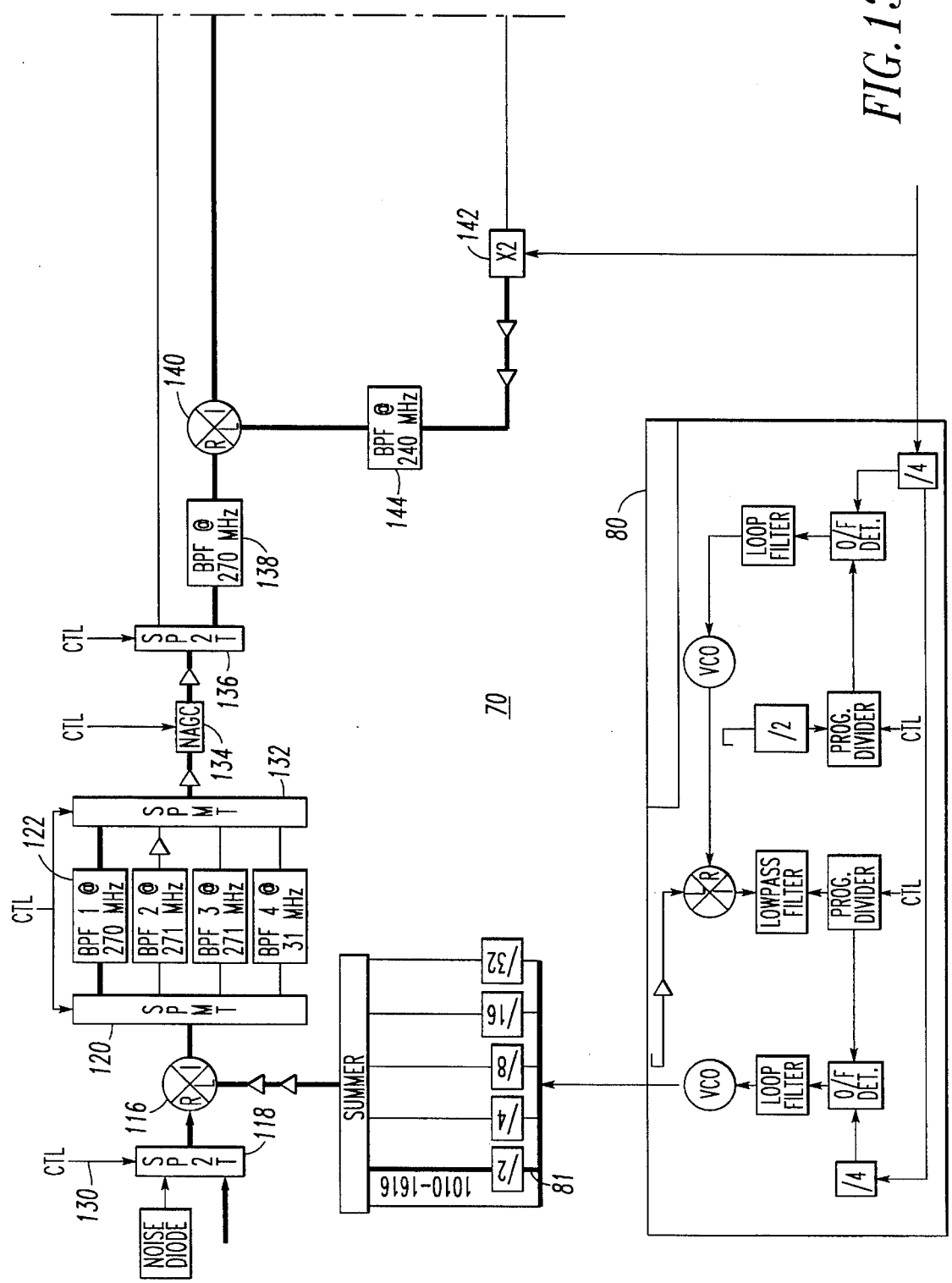
Figure 13B:
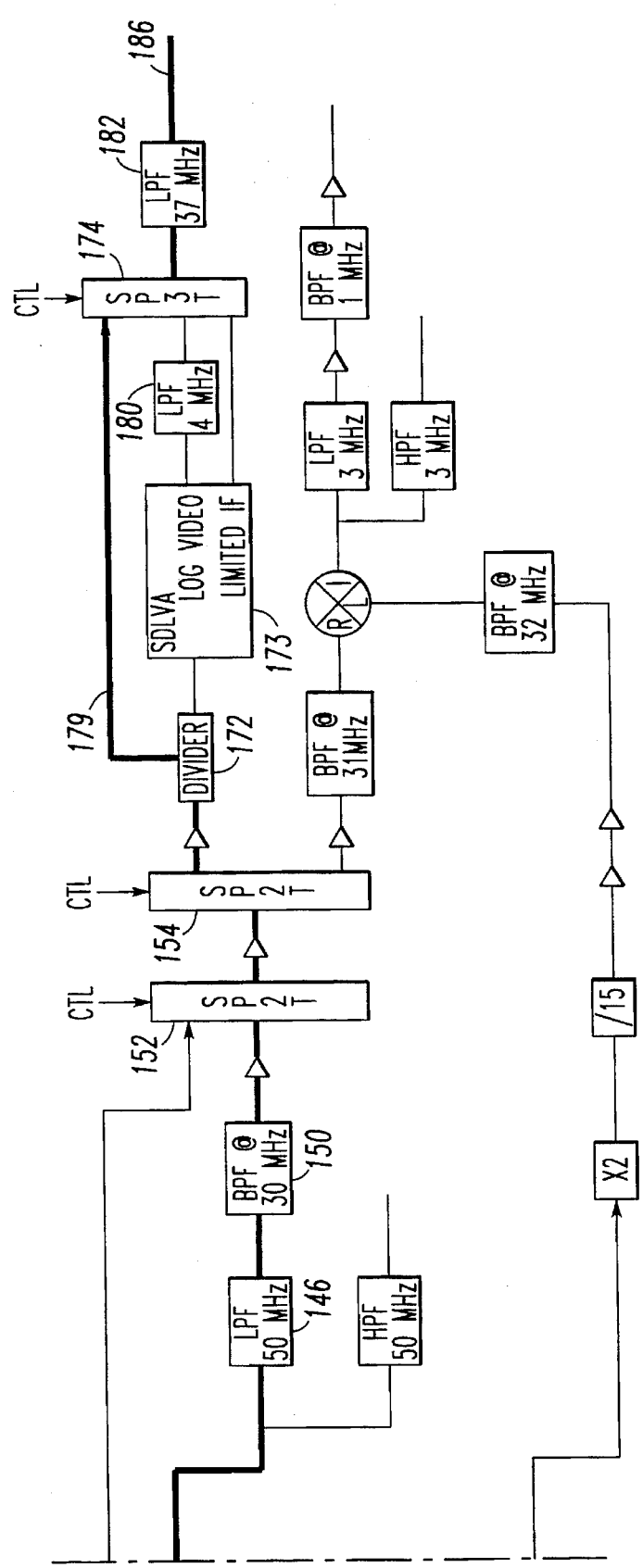

In Example 8, FIG. 13, wider bandwidth signals in essentially the same frequency range are used with the same tunable local oscillator signals. These signals include those of the Traffic Collision Avoidance System (TCAS) and wideband AM/FM Services. A final IF output of 30 MHz is provided by following the same path from frequency translator 116 as in the Example 2 of FIG. 7.

EXAMPLE 9

Figure 14A:
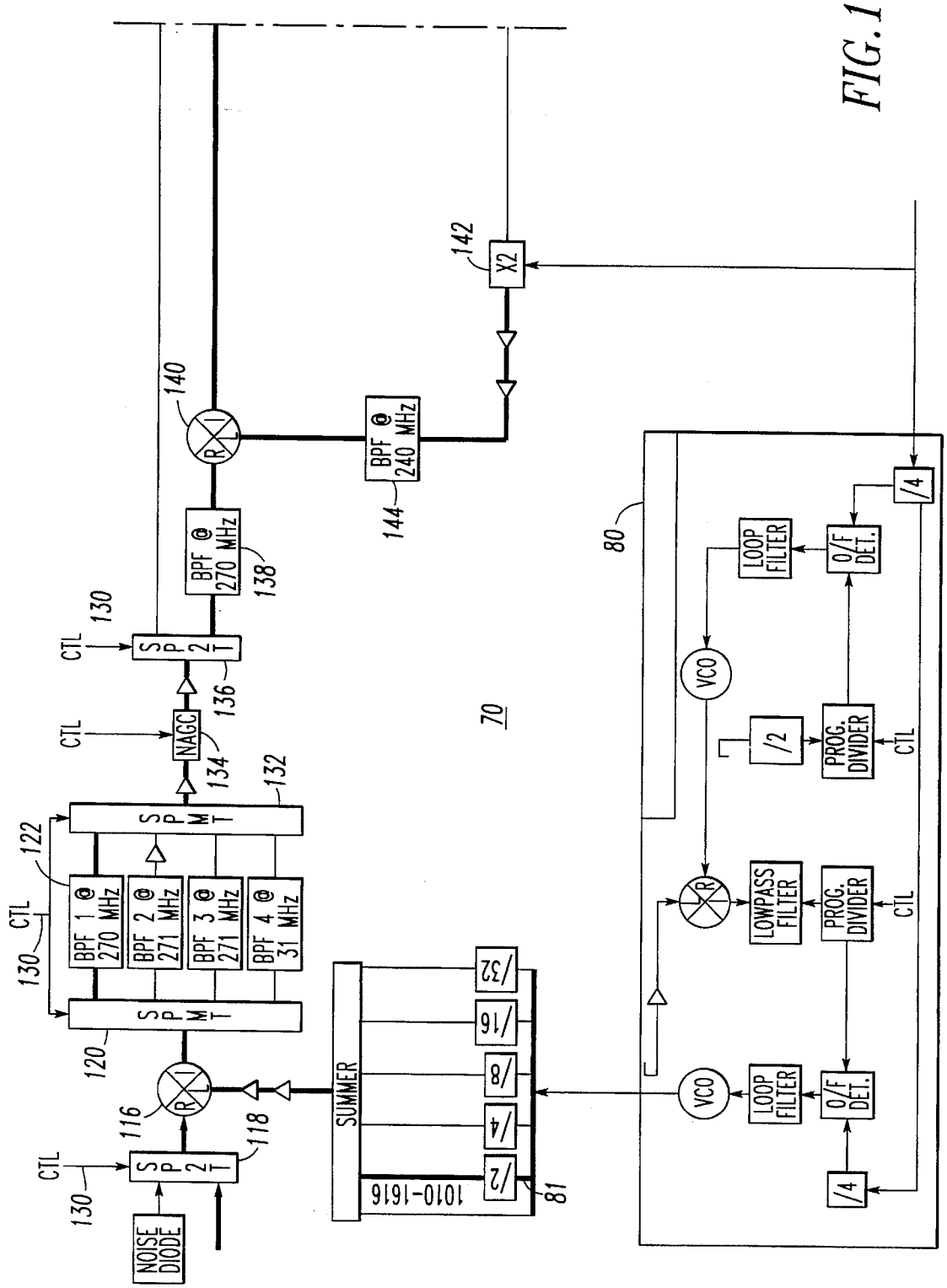
Figure 14B:
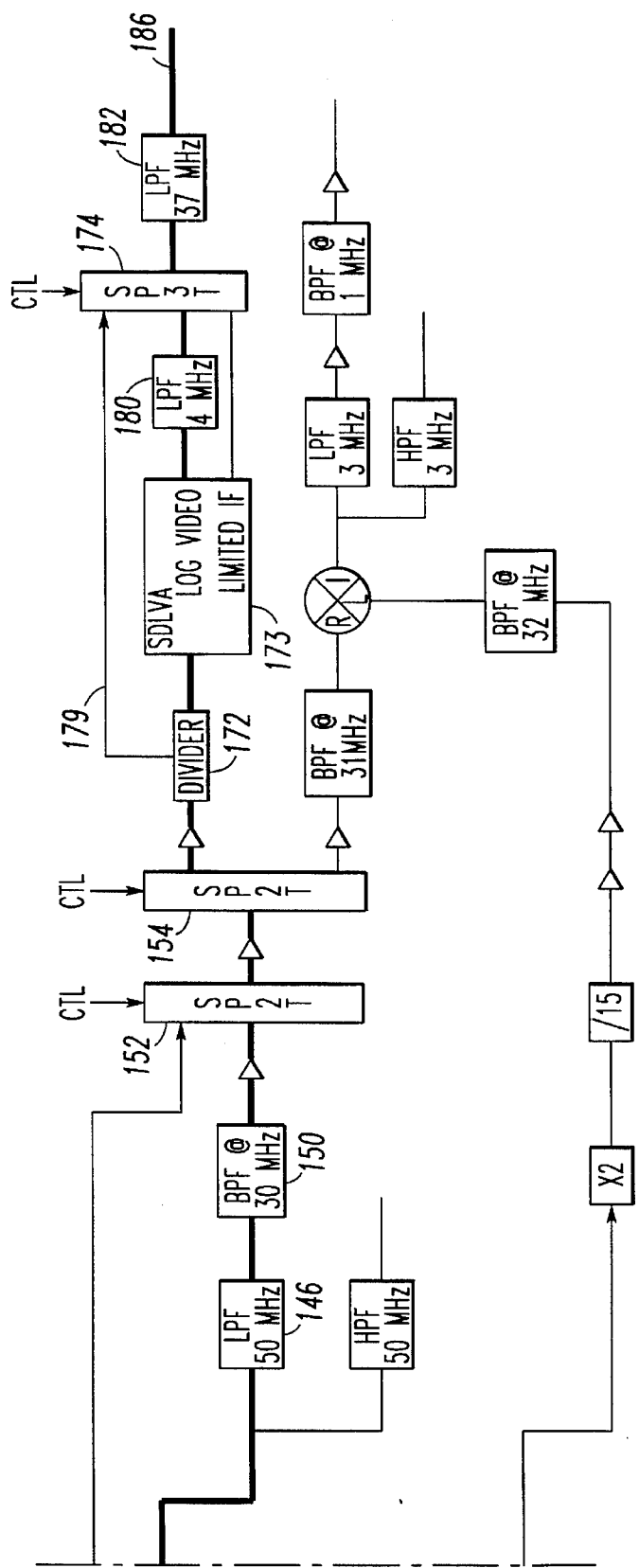

Example 9, per FIG. 14, shows a frequency conversion similar to that of Example 8, except that branch 173 from divider 172 is used. The input RF signals include Distance Measuring Equipment/Precision (DMEP), Air Traffic Control Radar Beacon System (ATC RBS), and Interrogate Friend-or-Foe.

EXAMPLE 10

Figure 15A:
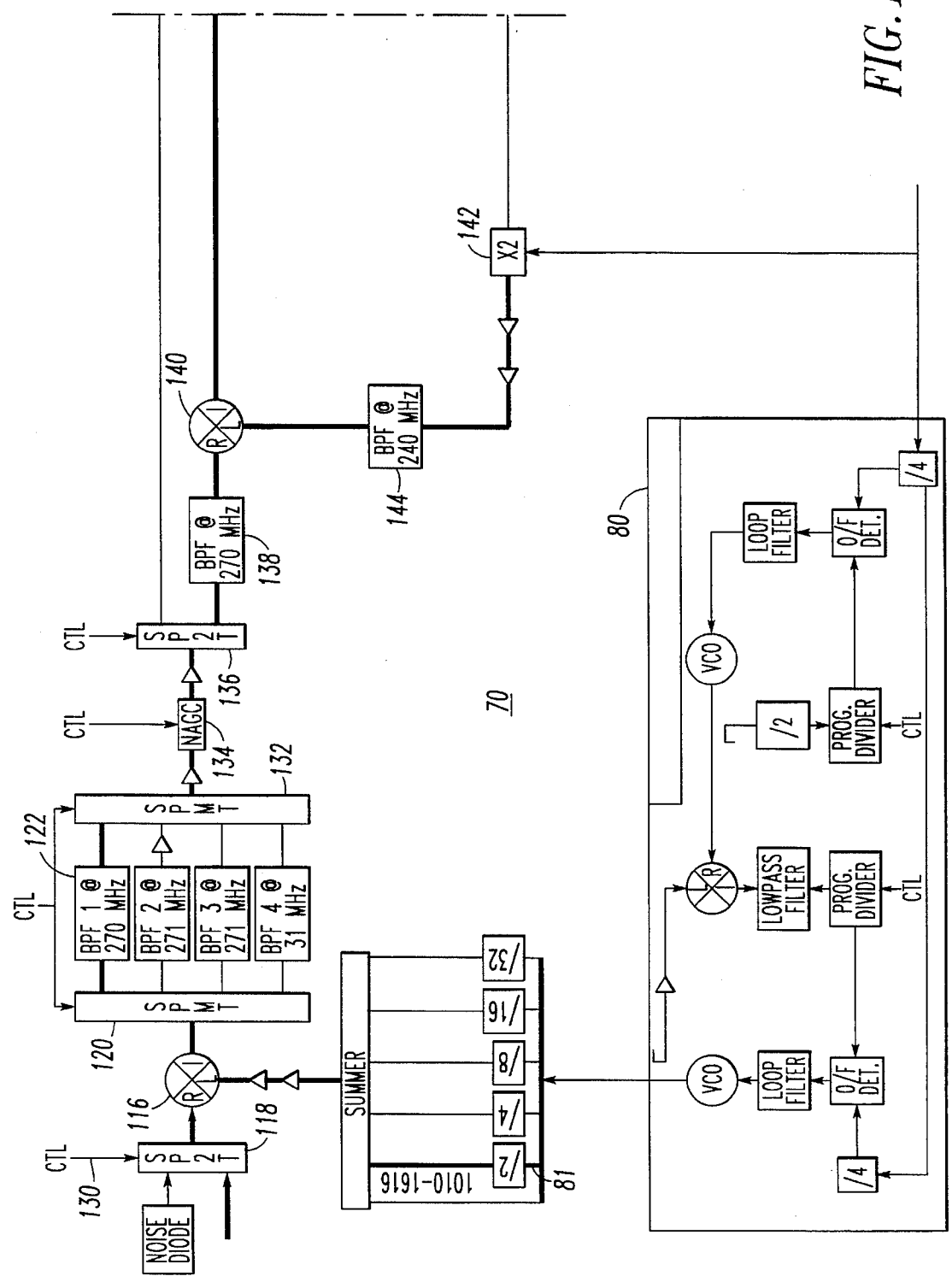
Figure 15B:
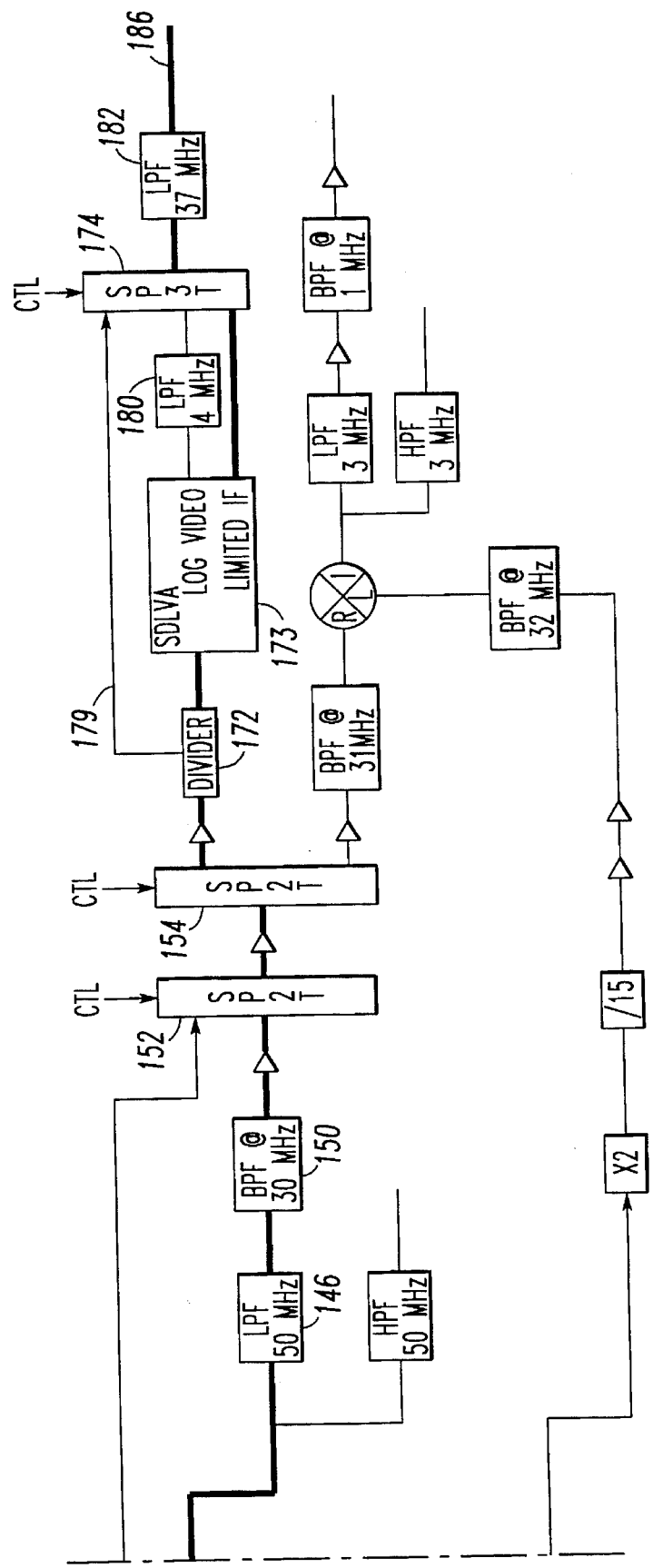

Example 10, per FIG. 15, is configured and employed as Example 9, except that branch 173 from divider 172, provides limited IF treatment instead of log video. Accordingly, switch 174 has to be a triple throw switch to provide such inputs on each of three possible paths to the common output.

The input RF signals include, among others, wideband FM services, such as JTIDS, GPS-C/A Code (Commercial Global Positioning), and Air Combat Maneuvering Instrumentation.

EXAMPLE 11

Figure 16A:
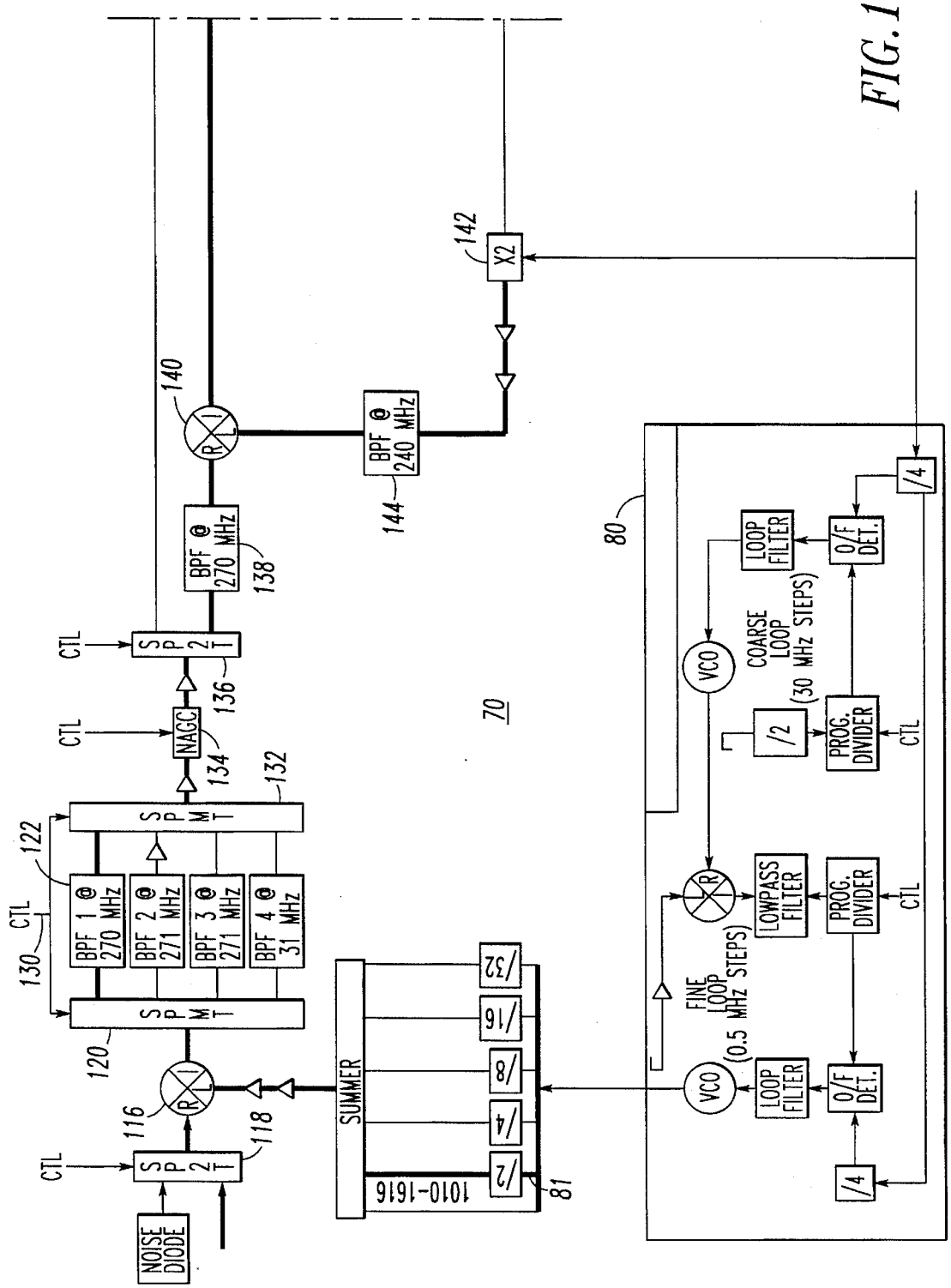
Figure 16B:
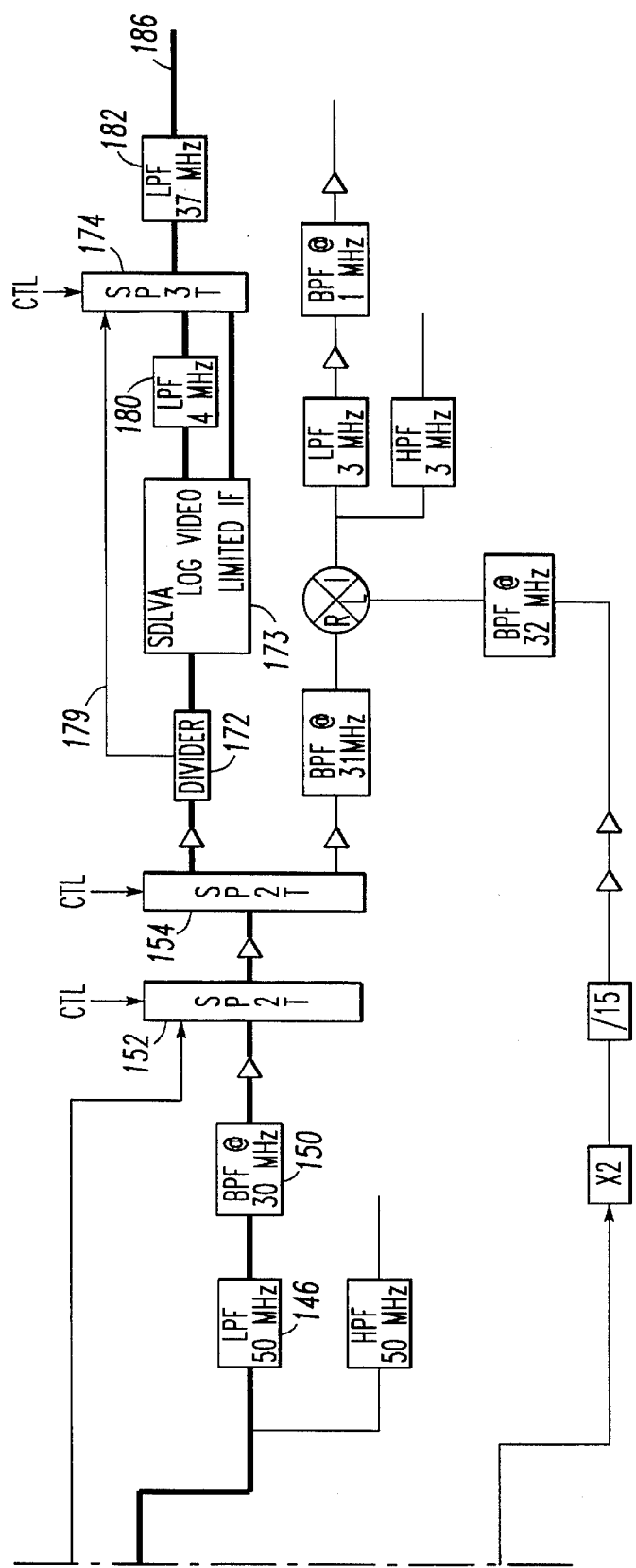

Example 11, per FIG. 16, operates on a Mode S signal at 1030 MHz. During the reception sequence, a Mode S transponder (not shown) switches in a way requiring switch 174, via control 130, to switch from the log video path of branch 173 to the limited IF path of branch 173.

As may be seen from the foregoing examples, a high degree of multiple use of the receiver IF converter components is achieved while handling a wide range of widely differing signals in the 2–2000 MHz range.

In short, an RF-to-IF converting receiver according to the invention represents essentially an order of magnitude improvement in achieving multiple use of frequency-conversion components. Thus, a level of integration can be contemplated that was previously not feasible from any of the viewpoints of size, weight, and cost.

In situations requiring simultaneous operation for two differing CNI received signals, economy of circuitry can still be achieved by applying the principles of the invention to the spare or back-up channels that provide needed redundancy.

Moreover, the principles of the invention are extendable to still wider frequency ranges. For example, input frequencies above 2000 Mhz may be converted by adapting the tunable local oscillator signal to a higher frequency, either by widening the tuning band of the double phase-locked loop 70 or by not dividing the double phase-locked loop output frequency prior to injection into the frequency translator 116.

It will be apparent to those skilled in the art that various modifications and variations can be made in the arrangement of the present invention and in the associated method without departing from the scope or spirit of the invention. For example, it is apparent to those skilled in the art that the invention can be easily scaled down by eliminating circuitry to accommodate a subclass of CNST functions (e.g., only narrow bandwidth functions), or can be scaled up by adding circuit modifications to include additional CNST functions or to improve performance. Also, for example, various circuits, including the double phase-locked loop and various filters can be reduced or deleted with an associated sacrifice in performance; various circuits can be modified or added to increase performance and applicability to CNST functions; the tuning range of the double phase-locked loop can be extended to provide additional RF/IF tuning flexibility among CNST functions; and the circuitry associated with the tunable and fixed local oscillators can be modified to accept a different external reference frequency.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A frequency converter comprising:

a first frequency-converting stage to which a received radio frequency signal is applied, said first frequency-converting stage including:

a first frequency translator having an input for the received radio frequency signal an input for a local oscillator signal and an output;

a source of a tunable radio-frequency signal coupled to the input for the local oscillator signal;

means for coupling the output of the first frequency translator to any one of a first plurality of bandpass filters;

a second frequency-converting stage including a second frequency translator having:

an input including a switch for selecting any of a plurality of the outputs of said first plurality of bandpass filters, an input for a local oscillator signal and an output;

a by-pass path coupled to the switch to bypass the second frequency translator;

a second source of a local oscillator signal coupled to the input for the local oscillator signal of the second frequency translator;

means for selectively coupling the output of the second frequency translator or the output of the bypass path to a third frequency translator or to one of a plurality of further paths in the frequency converter; and a third frequency-converting stage including:

the third frequency translator having an input coupled to the means for selectively coupling, and input for a third local oscillator signal and an output;

a plurality of third stage bypass paths coupling to the means for selectively coupling for bypassing the third frequency translator; and means for selectively transmitting the output of the third frequency translator or the output of any one of the plurality of the third stage bypass paths.

2. A frequency converter according to claim 1, wherein at least one of the first plurality of bandpass filters has a passband appropriate to a first plurality of frequency-converted radio frequency signals of a first bandwith, and wherein a second plurality of the frequency-converted radio frequency signals have a second bandwidth less than the first bandwith, and the means for coupling the output of the first frequency translator comprises means for coupling at least one of the second plurality of frequency-converted signals through the at least one bandpass filter, thereby providing multiple utilization of one of said plurality of bandpass filters.

3. A frequency converter according to claim 2, wherein the means for coupling the output of first frequency translator comprises means for coupling the second plurality of frequency-converted signals through the at least one bandpass filter.

4. A frequency converter according to claim 1, wherein the source of the tunable local oscillator signal, two fixed local oscillator signals, the first plurality of bandpass filters associated with the first frequency conversion stage, and the filters associated with the second and third frequency conversion states together provide respective frequencies and passbands for suppressing undesirable signals, such undesirable signals including either radio frequency interference co-existing with the desired signals at the input, image signals created at each frequency conversion stage by co-existing radio frequency interference, undesirable signals generated due to co-existing radio frequency interference interacting with circuit nonlinearities, or unwanted sidebands generated at the various frequency conversion stages.

5. A frequency converter according to claim 1, further comprising means for providing multiple first intermediate frequencies for the first frequency converter stage, at least one of which frequencies serves as the input frequency for the third frequency translator stage.

6. A frequency converter according to claim 1, wherein
the first frequency-converting stage frequency is adjusted to convert a majority of the commercial and military radio frequency signals from approximately 2 MHz to 2,000 MHz.

7. A frequency converter according to claim 6, further comprising
a control for selecting the frequency of the tunable local oscillator according to the respective received radio frequency signal to be frequency-converted.

8. A frequency converter according to claim 1, wherein
the source of the tunable radio frequency signal for the local oscillator signal comprises a double phase-locked loop synthesizer.

9. A frequency converter according to claim 8, further comprising divider circuits and selecting means for detecting one of said divider circuits, whereby the double phase-locked loop and the selecting means determine the RF/IF frequency combinations of the first frequency conversion stage.

10. A frequency converter according to claim 1, wherein
the means for selectively coupling the output of the second frequency translator or the output of the bypass path to the third frequency translator comprises a single-pole double-throw switch.

11. A frequency converter according to claim 1, wherein the plurality of third stage bypass paths comprises a linear bypass path and a log video bypass path and a divider from which said both paths branch; and the means for selectively transmitting comprises a single-pole, multiple throw switch intercepting both paths and sending said both paths to a common IF output.

* * * * *